US009087568B1

(12) United States Patent
Ware

(10) Patent No.: US 9,087,568 B1
(45) Date of Patent: Jul. 21, 2015

(54) MEMORY WITH MERGED CONTROL INPUT

(71) Applicant: Rambus Inc., Sunnyvale, CA (US)

(72) Inventor: Frederick A. Ware, Los Altos Hills, CA (US)

(73) Assignee: Rambus Inc., Sunnyvale, CA (US)

(*) Notice: Subject to any disclaimer, the term of this patent is extended or adjusted under 35 U.S.C. 154(b) by 131 days.

(21) Appl. No.: 13/848,832

(22) Filed: Mar. 22, 2013

Related U.S. Application Data

(60) Provisional application No. 61/619,345, filed on Apr. 2, 2012.

(51) Int. Cl.
*G11C 8/00* (2006.01)
*G11C 8/18* (2006.01)
*G11C 7/22* (2006.01)

(52) U.S. Cl.
CPC .......................................... *G11C 7/22* (2013.01)

(58) Field of Classification Search
USPC .......... 365/189.05, 189.08, 189.12, 220, 221, 365/222, 233.1, 233.11, 233.12
See application file for complete search history.

(56) References Cited

U.S. PATENT DOCUMENTS

| 7,761,724 | B2 | 7/2010 | Rajan et al. |
| 8,006,057 | B2 | 8/2011 | LaBerge |
| 8,509,020 | B2 * | 8/2013 | Kajigaya .................. 365/189.05 |
| 8,737,106 | B2 * | 5/2014 | Best et al. .................. 365/233.1 |
| 2010/0165782 | A1 | 7/2010 | Lee |

* cited by examiner

*Primary Examiner* — Trong Phan
(74) *Attorney, Agent, or Firm* — Charles Shemwell

(57) ABSTRACT

Chip selection and internal clocking functions are enabled within an integrated circuit memory component in response to a single "chip-enable" control signal, thus reducing memory system pin count and wiring complexity relative to designs that require separate chip-select and clock-enable signals. Internal clocking logic may also be provided to generate timing signal edges more precisely limited to the number required to complete a given memory component operation, reducing the number of unnecessary timing events and lowering power consumption. Further, internal read and write clock signals may be speculatively enabled within the memory component to more quickly stabilize those clocks in preparation for data transmission and reception operations, potentially lowering memory access latency.

31 Claims, 11 Drawing Sheets

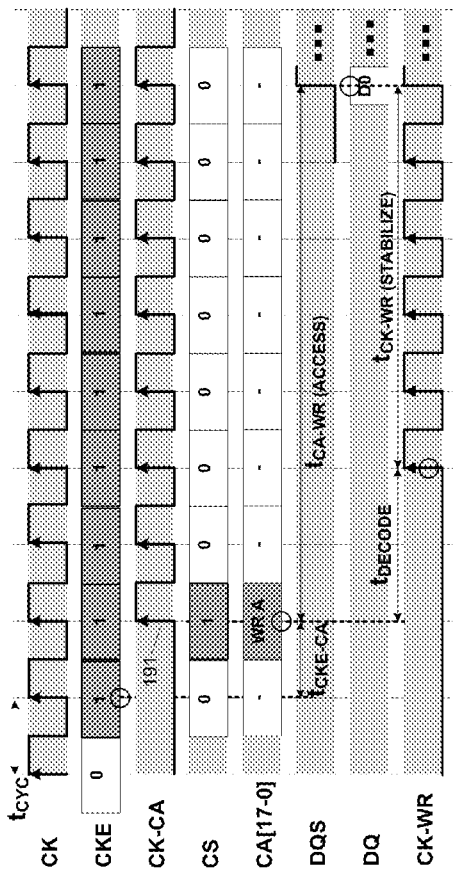
FIG. 1B  *Multi-Bit-Control – Write Access*
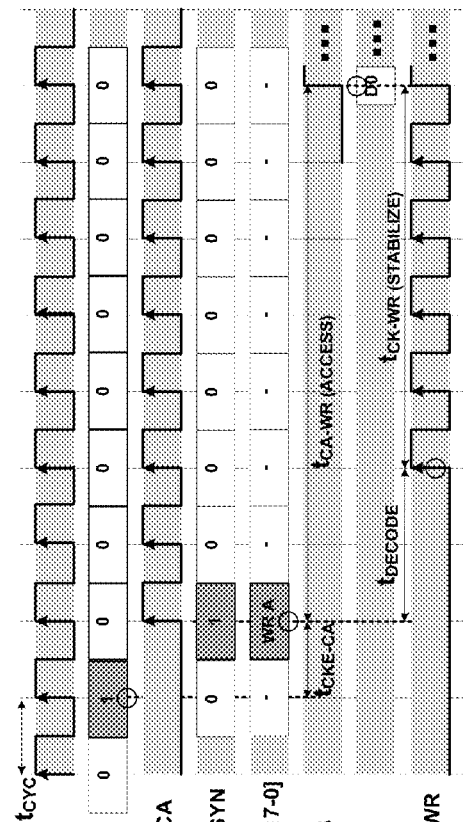
FIG. 1C  *Merged Control – Write Access*
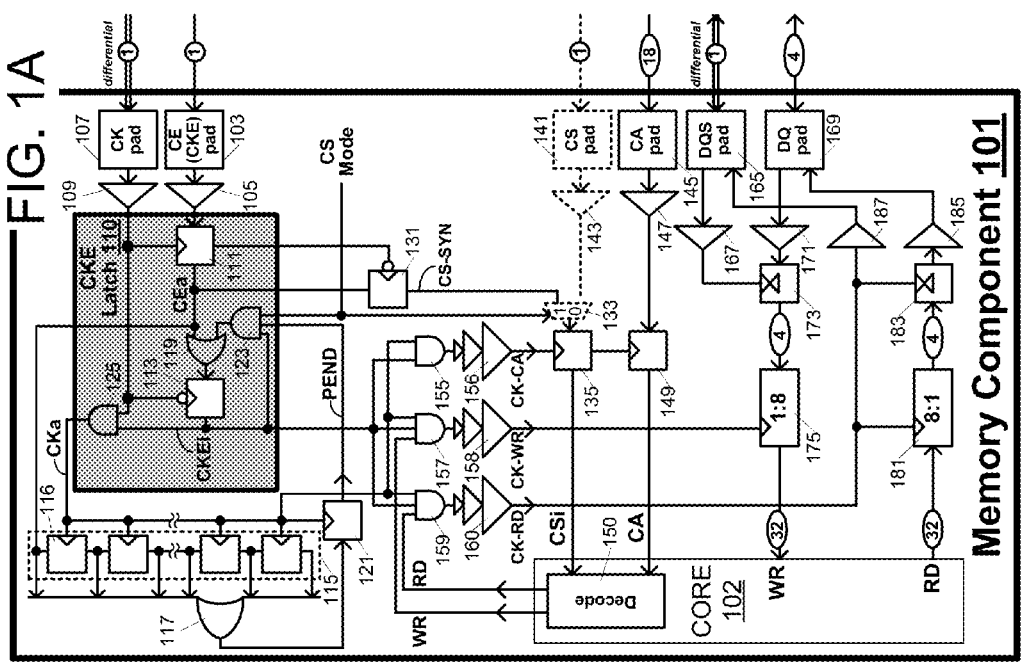
FIG. 1A

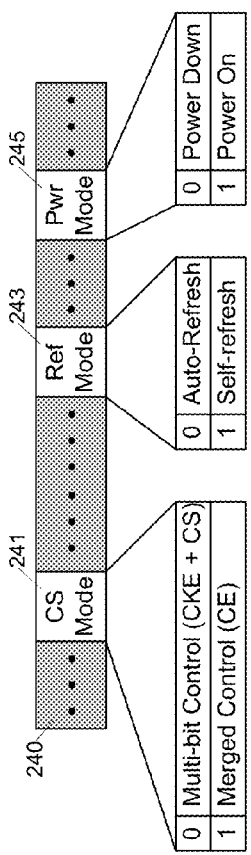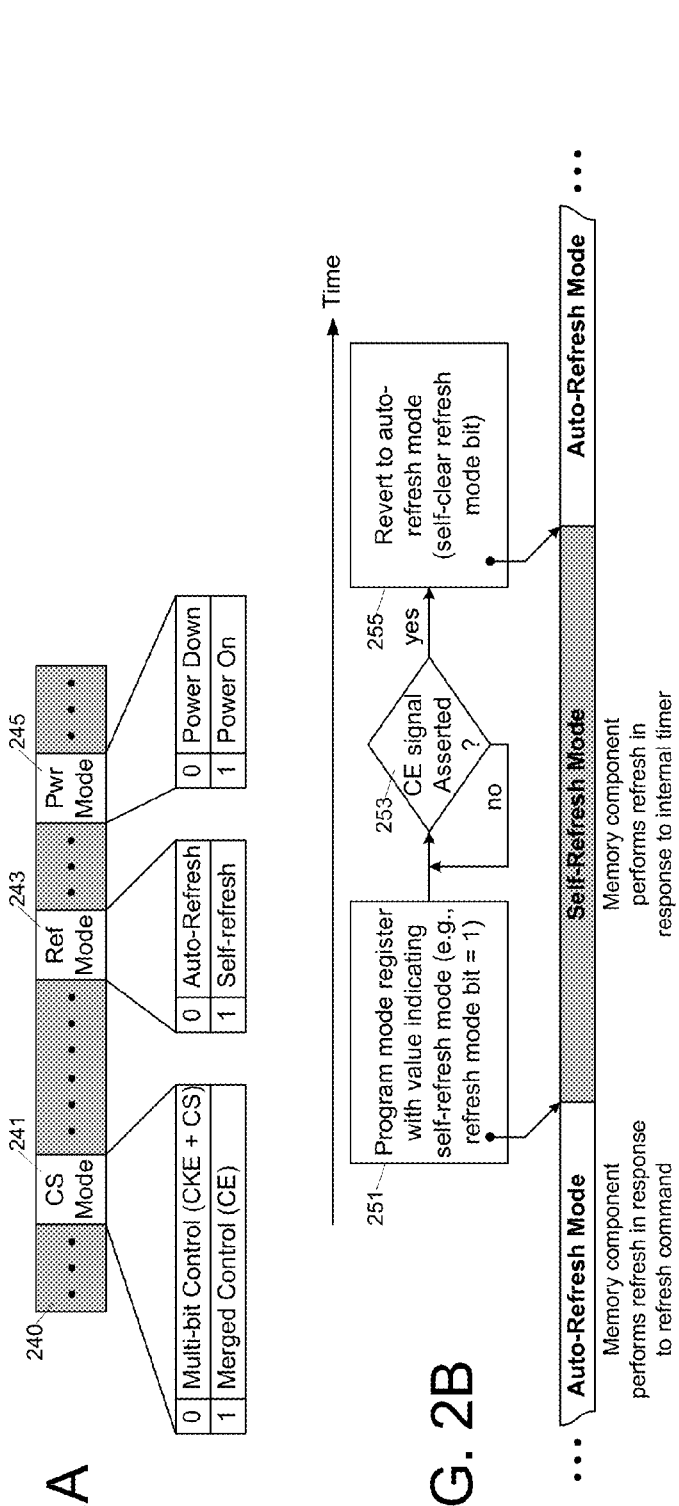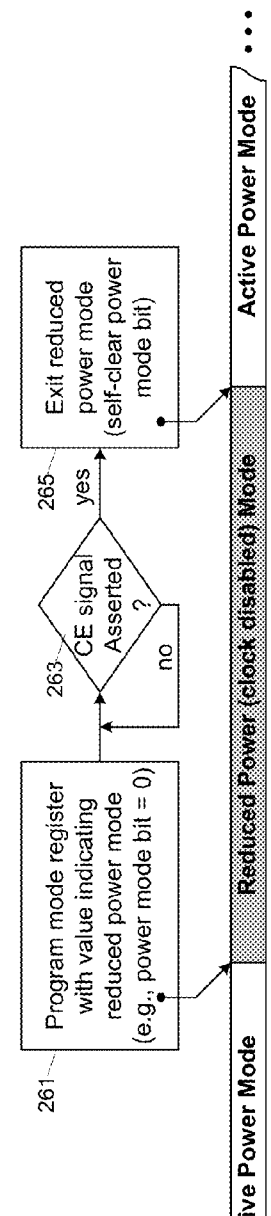
FIG. 2A
FIG. 2B
FIG. 2C

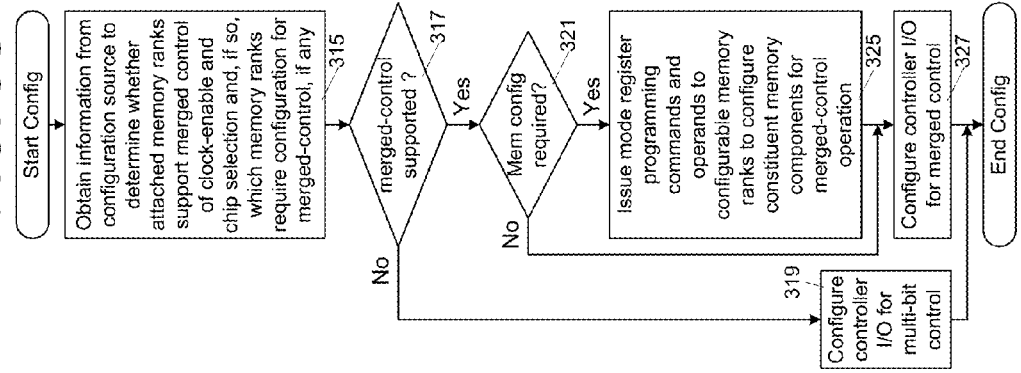
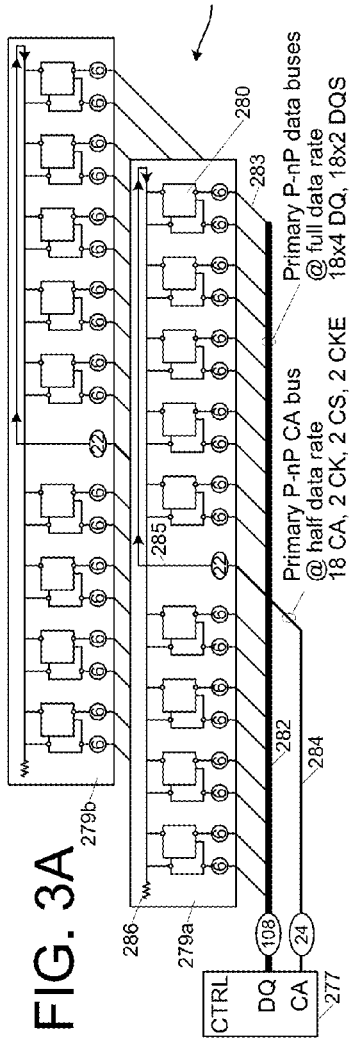
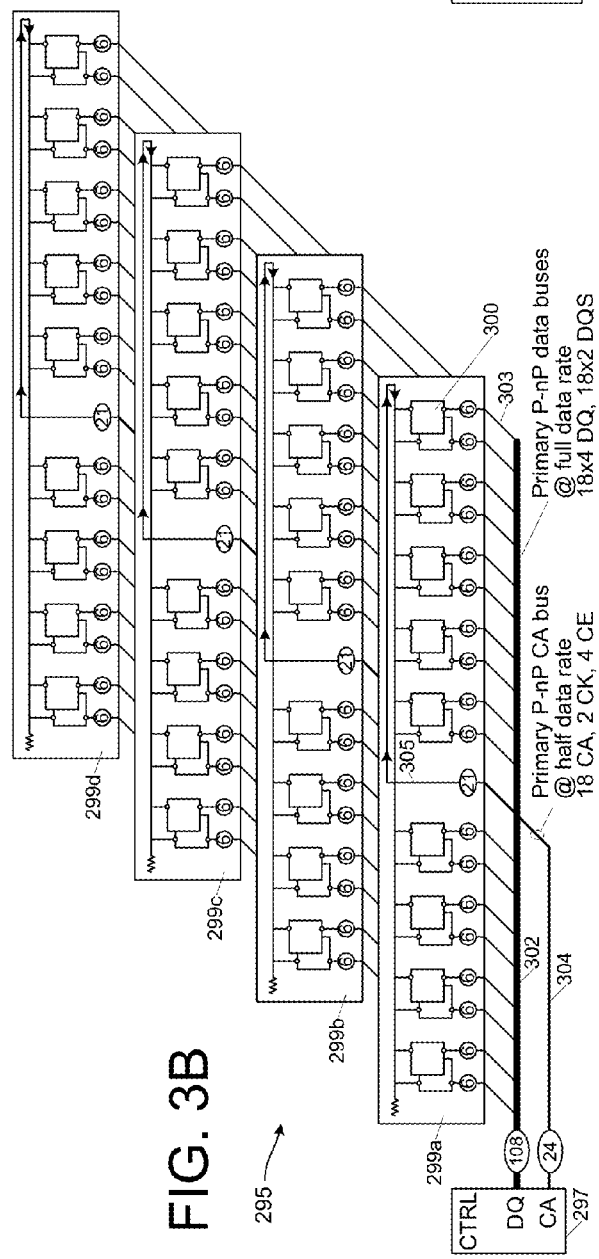

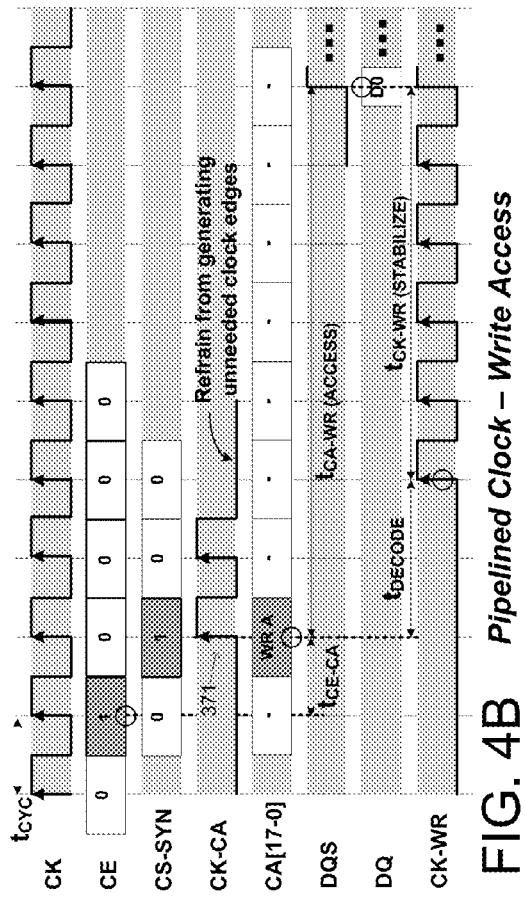
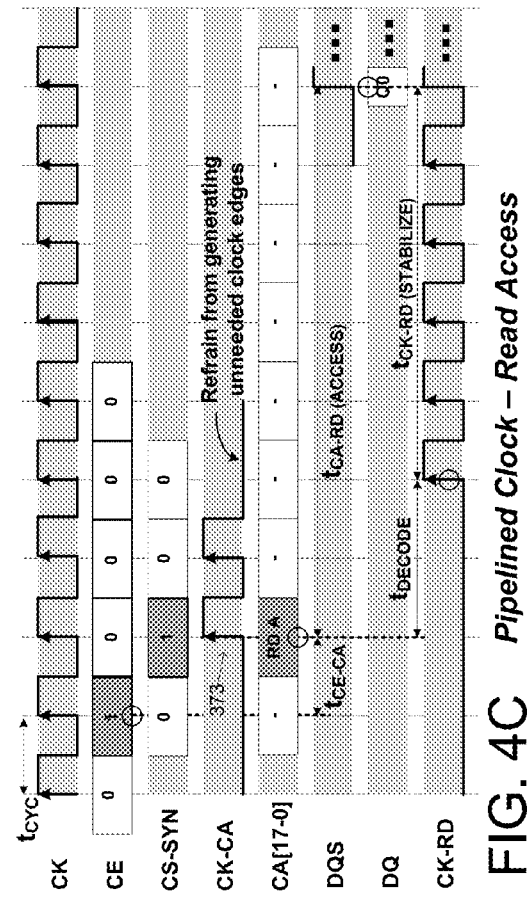
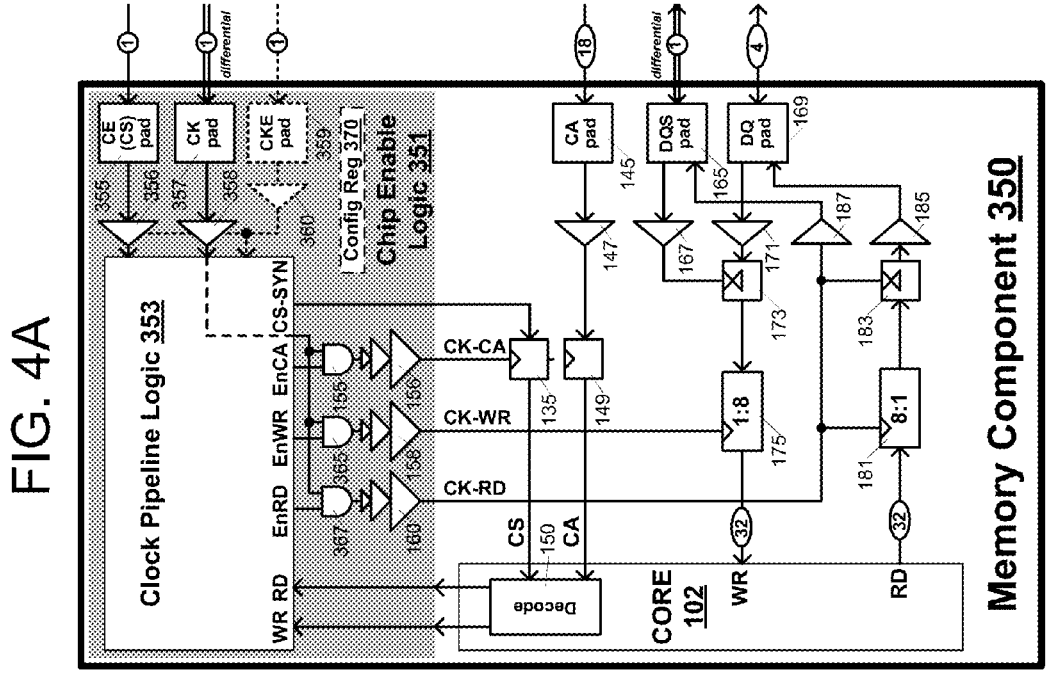
FIG. 4A
FIG. 4B  *Pipelined Clock – Write Access*
FIG. 4C  *Pipelined Clock – Read Access*

FIG. 9A  Write Access with Speculative WR Clock Enable
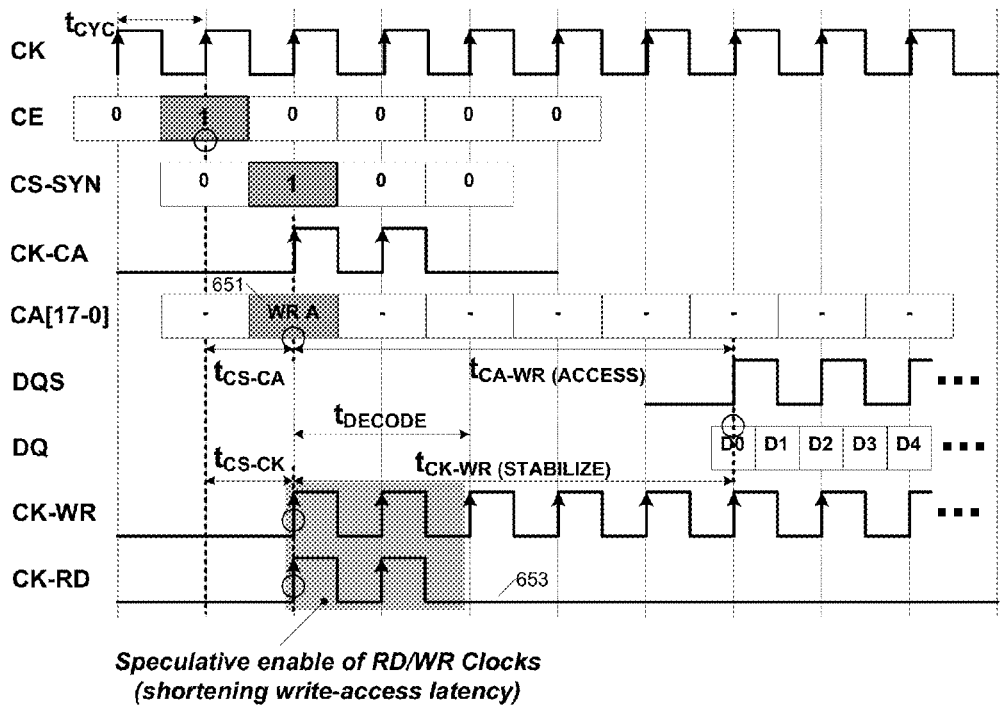
Speculative enable of RD/WR Clocks
(shortening write-access latency)
FIG. 9B  Read Access with Speculative RD Clock Enable
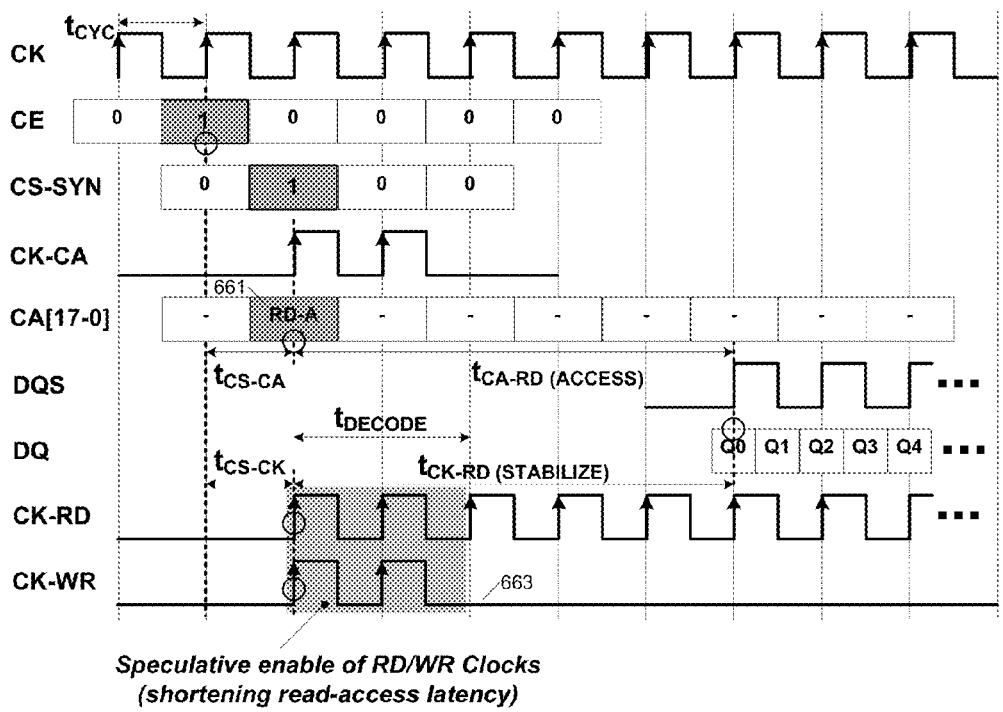
Speculative enable of RD/WR Clocks
(shortening read-access latency)

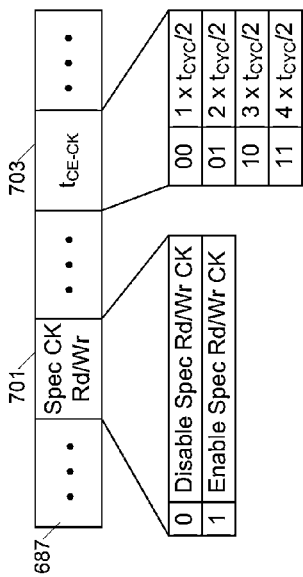
FIG. 10A
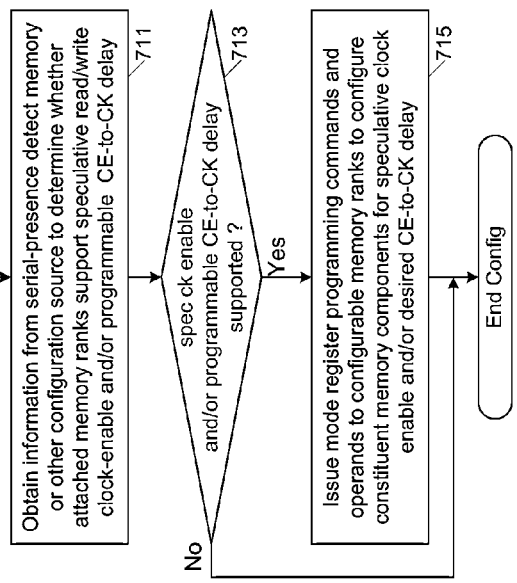
FIG. 10B
FIG. 10C
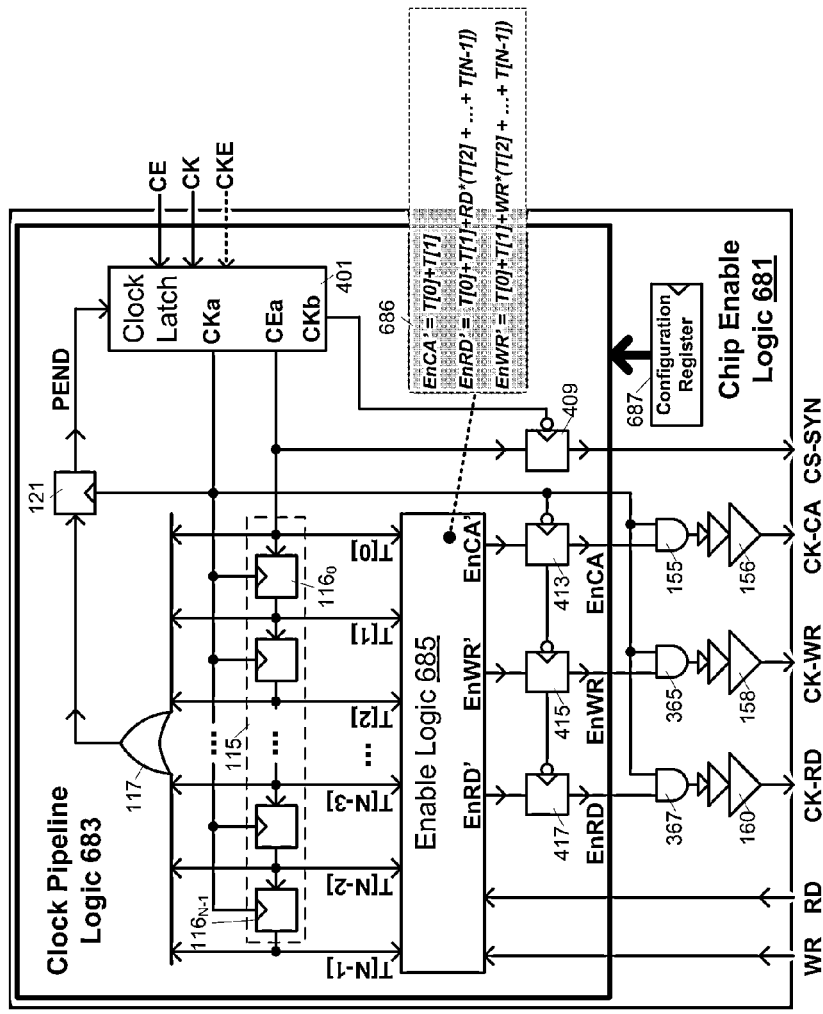

MEMORY WITH MERGED CONTROL INPUT

TECHNICAL FIELD

The present disclosure relates to integrated circuit memory systems and memory system components.

BACKGROUND

Modern integrated-circuit memory systems are often composed of independently selectable "ranks" of memory components, with each rank receiving a number of dedicated control signals from a control component. In a typical implementation, each memory rank receives a dedicated clock-enable signal to enable constituent memory components to be switched into and out of a low-power state without affecting other memory ranks, and a dedicated chip-select signal to enable the rank of memory components to receive and respond to memory access commands exclusively and thus without contention from components within other memory ranks. While the conventional control approach may be sufficient in legacy systems, memory rank proliferation due to advances in system architecture and component packaging have begun to strain system resources. In module-threaded systems, for example, individual ranks of memory components may optionally be operated as two or more smaller ranks, thus multiplying the requisite number of dedicated rank control signals, driving up control-component pin count and increasing system wiring complexity. The control signal count is similarly multiplied by packaging advances that permit memory components to be stacked or otherwise arranged in a manner that increases the number of memory ranks disposed within a given footprint (e.g., four, eight or more memory ranks per memory module instead of the traditional one or two), again, driving up pin count and increasing wiring complexity.

BRIEF DESCRIPTION OF THE DRAWINGS

Various embodiments disclosed herein are illustrated by way of example, and not by way of limitation, in the figures of the accompanying drawings, in which like reference numerals and text legends refer to similar elements and in which:

FIG. 1A illustrates an embodiment of a "merged-control" memory component in which read/write access and wake-up from reduced power state may be initiated in response to a single "chip-enable" control signal;

FIG. 1B illustrates a multi-bit control mode of operation within the merged-control memory component of FIG. 1A;

FIG. 1C illustrates a merged-control mode of operation with the merged-control memory component of FIG. 1A;

FIGS. 2A-2C illustrate an exemplary implementation of a mode register that may be included within the merged-control memory component of FIG. 1A and exemplary management of memory refresh and power-state modes within the memory component;

FIGS. 3A and 3B illustrate embodiments of respective memory systems having components capable of operating in either multi-bit control mode or merged control mode;

FIG. 3C illustrates an exemplary sequence of operations that may be carried out within a control component that supports both multi-bit control and merged control operation;

FIG. 4A illustrates an embodiment of a merged-control memory component that implements a timing pipeline to generate exactly or approximately the number internal clock pulses needed to receive and execute an incoming command;

FIGS. 4B and 4C illustrate exemplary write-access and read-access operations within the merged-control memory component of FIG. 4A;

FIGS. 9A and 9B illustrate speculative enablement of write and read within an alternative embodiment or configuration of a clock pipeline logic circuit;

FIG. 10A illustrates an embodiment of a chip-enable logic circuit that supports the speculative read and write clock enable functions described in reference to FIGS. 9A and 9B;

FIG. 10B illustrates an embodiment of a configuration register that may be included within (or provided in connection with) the chip-enable logic circuit of FIG. 10A; and FIG. 10C illustrates an exemplary sequence of operations that may be carried out within a control component to detect and enable speculative clock-enable capability and/or support for programmable chip-enable to clock delay within attached memory components.

DETAILED DESCRIPTION

Figure 5B:
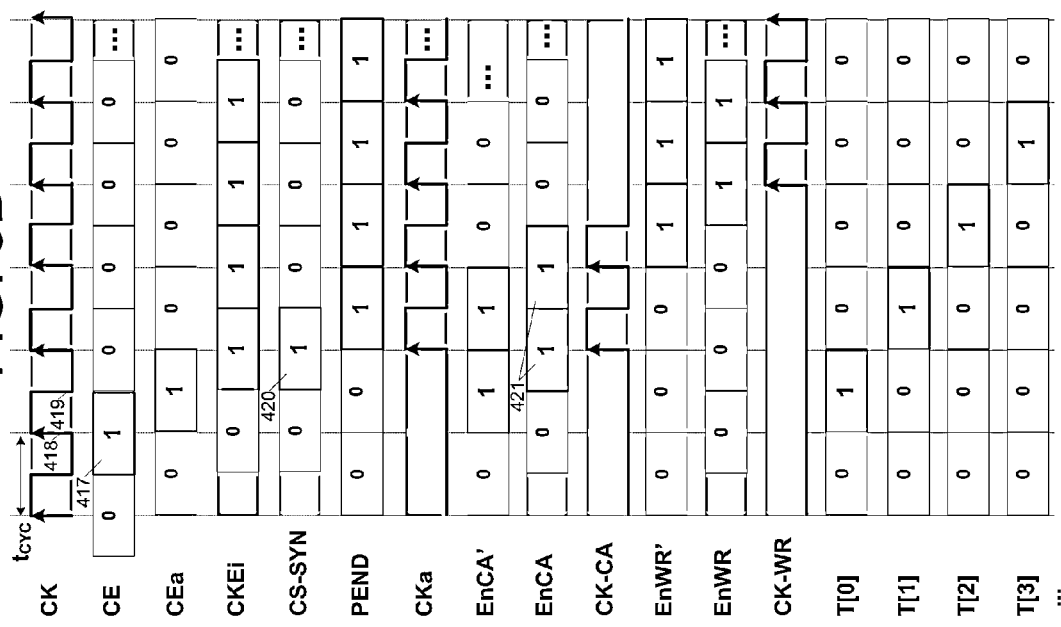
FIG. 5B presents an exemplary timing diagram corresponding to operations within the clock pipeline logic circuit of FIG. 5A.

In various embodiments disclosed herein, chip selection and internal clocking functions are enabled within an integrated-circuit memory component in response to a single "chip-enable" control signal, thus reducing memory system pin count and wiring complexity relative to designs that require separate chip-select and clock-enable signals. In other embodiments, internal clocking logic is provided within the memory component to generate timing signal edges more precisely limited to the number required to complete a given operation, reducing the number of unnecessary timing events and lowering power consumption. In yet other embodiments, internal read and/or write clock signals may be speculatively enabled within the memory component to more quickly stabilize those clocks in preparation for read data transmission and/or write data reception, potentially lowering memory access latency. These and other embodiments, features and benefits are described in further detail below.

FIG. 1A illustrates an embodiment of a "merged-control" memory component in which read/write access and wake-up from reduced power state (i.e., transition from clock-disabled to a clock-enabled operating state) may be initiated in response to a single control signal, referred to herein as a "chip-enable." That is, instead of receiving separate clock-enable and chip-select signals, the control effected by those two signals may be merged into the chip-enable signal ("CE") received via pad 103 ("CE (CKE)") and signal receiver 105.

In the implementation shown, the merged-control memory component includes a surplus "chip-select" signal pad 141 and receiver 143 and may be configured to operate in either a multi-bit control mode in which separate clock-enable (CKE) and chip-select signals (CS) are received via respective pads 103 and 141 (and via receivers 105 and 143), or in a merged control mode in which signal pad 141 and receiver 143 are unused and the memory component responds instead to a chip-enable signal received via pad 103 and receiver 105.

In multi-bit control mode, an exemplary timing diagram for which is presented in FIG. 1B ("Multi-Bit-Control—Write Access"), a clock-enable signal ("CKE") is latched within flip-flop 111 in response to a rising edge of an incoming clock signal (i.e., "CK," received via pad or pads 107 and receiver 109 of FIG. 1A and having cycle time $t_{CYC}$) and then passes through OR gate 119 to be latched within flip-flop 113 in response to the ensuing falling clock edge. The output of flip-flop 113 constitutes an internal clock-enable signal, "CKEi," and is supplied to logic AND gates 155, 157 and 159 to enable generation of a command/address clock (CK-CA), write clock (CK-WR) and read clock (CK-RD) within clock tree circuits 156, 158 and 160, respectively. The internal clock-enable signal (CKEi) is, in effect, a clock-cycle-delayed replica of the externally-supplied clock-enable signal and, as such, remains high so long as the external clock-enable signal remains asserted. Accordingly, as shown in FIG. 1B, the control component maintains the external clock enable signal at a high state as shown by the sequence of logic '1' signal values at least for the duration of the commanded operation (i.e., as long as necessary to enable generation of requisite timing signal edges). Note that the CK signal arriving at pad 107 of FIG. 1A is shown as a differential signal (i.e., via the designation "differential" or "diff" as used in connection with other signals shown in FIG. 1A and other drawing figures herein) conveyed via a two-line signaling link, though, as discussed below, a single-ended CK signal may be provided in alternative embodiments.

Still referring to FIGS. 1A and 1B, a command/address value ("CA") is received via pads 145 and receivers 147, latched within flip-flop 149 in response to a rising edge 191 of the command/address clock (also referred to herein as a "command clock", CK-CA), and supplied from flip-flop 149 to a command input of a decode logic circuit 150 within memory core 102. Note that an 18-bit command/address value is shown in FIG. 1A (as indicated by the bit-width ("18" in this example) within ellipse/circle on signal line incoming to CA pad 145, and also by the designation "CA[17:0]" in FIGS. 1B and 1C—drawing conventions used herein to indicate exemplary signal-link widths for the CA signal path and other signal paths/lines shown in FIGS. 1A-1C and with respect to other figures discussed below), though, as explained below, larger or smaller command/address values may be supplied in alternative embodiments. In multi-bit control mode, a chip-select signal (CS), received via pad 141/receiver 143 and forwarded via mode-control multiplexer 133, is latched within flip-flop 135 in response to the same rising edge of the command clock (i.e., edge 191) and supplied to an enable input of decode logic circuit 150. Decode logic circuit 150 responds to the chip-select signal assertion (i.e., high state of internal chip-select signal "CSi" from flip-flop 135) by decoding the command/address value presented at the command input and issuing core control signals as necessary to carry out the commanded operation. Accordingly, in a memory system in which each of multiple ranks of memory components receives a dedicated chip-select signal, asserting a chip select signal corresponding to one memory rank while deasserting the chip select signals corresponding to the remaining ranks effects an exclusive selection of the one memory rank, enabling that memory rank to decode and respond to a memory access command transmitted on a shared command/address path without contention from other memory ranks.

Upon decoding a command/address value that indicates a memory read or write operation, the decode logic circuit asserts read or write enable signals (shown as signals "RD" and "WR" in FIG. 1A), respectively, as well as control signals that enable read or write access to a storage array within the memory core in accordance with address information provided in the CA value. As shown, the read and write enable signals are supplied to logic gates 159 and 157, respectively, to enable generation of read and write clock signals, CK-RD and CK-WR, within respective clock trees 160 and 158. In the exemplary memory write operation shown in FIG. 1B (i.e., the incoming command "WR A" indicates a memory write operation), incoming write data values (each shown to be 4-bits in FIG. 1A, though larger or smaller write data values may be transferred in each transmit interval) are received sequentially via DQ pads 169 and receivers 171 and then latched sequentially within flip-flop 173 in response to a corresponding sequence of rising and falling edges of a data strobe signal (i.e., DQS—a timing signal received via pad 165 and receiver 167). The stream of "sampled" data values output from flip-flop 173 is deserialized within 1:8 deserializing circuit 175 to produce a 32-bit write data value to memory core 102. More specifically, deserializing circuit 175 parallelizes eight sets of four bits received from flip-flop 173 in response to a sequence of rising and falling edges of the write clock signal (i.e., after the write clock is enabled by assertion of the write clock-enable signal and allowed time to stabilize as shown by time interval "$t_{CK\text{-}WR\ (STABILIZE)}$" in FIG. 1B) over a four-clock-cycle burst interval to provide a 32-bit write data value at write input ("WR") of memory core 102.

The elapsed time between receipt of write command "WR A" and receipt of the eight 4-bit write data values (only the first of which ("D0") is shown in FIG. 1B) is referred to herein as the "write access latency" ($t_{CA\text{-}WR\ (ACCESS)}$), the time required for the memory component to prepare memory core 102 to be written with incoming data. In the embodiment shown, the write access latency includes time required for incoming address signals to propagate through address logic (not shown) in memory core 102, an event that takes place in parallel with command decoding and/or enabling of the write clock. Thus, as shown in FIG. 1B, the write access latency interval spans a command decode interval ($t_{DECODE}$) and the above-mentioned write clock stabilization time ($t_{CK\text{-}WR\ (STABILIZE)}$). Longer or shorter write access latencies than shown in FIG. 1B may apply in alternative embodiments or configurations, particularly where the command decode interval and write clock stabilization time elapse concurrently.

The data flow direction is reversed in a memory read operation, with a 32-bit read data word from memory core 102 being serialized by output serializer 181 into eight sets of four-bit data values that are successively latched within flip-flop 183 (i.e., "8:1" serialization in response to successive rising and falling edges of read clock, CK-RD, following enablement and stabilization of that clock), and then output from the memory component via output drivers 175 and signal pads 169 as a sequence (or burst) of eight four-bit values. As shown in FIG. 1A, in addition to clocking the serializer and output flip-flop 183, the read clock is supplied to output driver 187 to be output via pad 165 as a read strobe signal (i.e., a timing signal used to time reception of read data at a recipient control component).

As described above and shown in FIG. 1B, write data arrives at the memory component a predetermined number of clock cycles after the chip-select and command/address signals to provide time for decode logic circuit 150 to decode the corresponding write command ($t_{DECODE}$) and, after the command has been identified as a write command and the write-clock-enable signal asserted, to provide time for the write clock to stabilize ($t_{CK\text{-}WR(STABILIZE)}$) at the output of clock tree 158. Though not specifically shown, similar decode and clock stabilization delays are imposed in a data read operation before read data is output from the memory component, though at least a portion of that time may be hidden under the read data retrieval operation within the memory core.

In the embodiment of FIG. 1A, mode-control multiplexer 133 is switched between a multi-bit control state and a merged-control state in response to a chip-select-mode signal (e.g., a signal provided from a programmable register or other configuration source and depicted as "CS Mode"). As explained, in the multi-bit control state, a chip-select signal received via pad 141 is forwarded to decode logic circuit 150 as an internal chip-select signal, "CSi," to enable command/address decoding. By contrast, when the chip-select-mode signal is switched to the merged-control state, the input from chip-select pad 141 is ignored and a synthesized chip-select signal, "CS-SYN," generated in response to a chip-enable signal, received via pad/receiver 103/105 and clocked into flip-flops 111 and 131 in response to successive rising and falling edges of an incoming clock signal, is passed instead to decode logic 150 as the internal chip-select signal. Because the chip-enable signal performs a chip-select function, it is asserted for a limited number of clock cycles corresponding to the number of clock cycles in which the decode logic circuit within the memory core is to be enabled to receive command/address information via flip-flop 149 (i.e., one clock cycle in this example, though command/address information may be delivered over a sequence of two or more clock cycles in alternative embodiments). Because the chip-enable signal also performs a clock-enable function, however (i.e., enabling the very command/address clock that will be used to latch the incoming command/address value), the chip-enable signal is transmitted by the control component (and thus received by memory component 101) one or more clock cycles ($t_{CKE\text{-}CA}$) in advance of the write command as shown in timing diagram FIG. 1C ("Merged Control—Write Access"), with the synthesized chip-select signal being generated with a corresponding delay.

Still referring to FIGS. 1A and 1C, memory component 101 includes clock-enable latching logic 110 ("CKE Latch") to maintain assertion of the internal clock enable signal (CKEi) for a predetermined number of clock cycles (i.e., as long as necessary to enable generation of requisite timing signal edges) after the externally-supplied chip-enable signal has been lowered. More specifically, the chip-enable signal latched within flip-flop 111 (i.e., "CEa") is supplied to a shift register 115 formed by daisy-chained flip-flops 116 having outputs coupled to respective inputs of logic OR gate 117. Flip-flops 116 are clocked by a gated version of the incoming clock signal (i.e., CKa, generated by a logical AND of the clock signal and the internal clock enable signal, CKEi, in gate 125) so that a single-cycle assertion of a chip-enable signal is shifted from one flip-flop to another within shift register 115 to yield a logic high signal at the output OR gate 117 for a number of clock cycles corresponding to the length of the shift register. The output of OR gate 117 is loaded into flip-flop 121 in response to each rising edge of the CKa signal, thus yielding a "PEND" signal that goes high at the rising clock signal edge immediately following assertion of the internal clock-enable signal CKEi within flip-flop 113. As shown, the PEND signal is supplied, together with the internal clock-enable signal and the chip-select mode signal ("CS Mode"), to logic AND gate 123, thereby providing a high input to flip-flop 113 via OR gate 119. By this operation, even after the externally supplied chip-enable signal goes low (e.g., after being asserted for a single clock cycle or a limited number of clock cycles), internal clock enable signal CKEi will remain high (i.e., is latched) for a number of clock cycles corresponding to the length of shift register 115, thus enabling generation of internal clock signal CKa for at least as long as necessary to carry out a commanded operation. As discussed below, the number of daisy-chained flip-flops 116 within shift register 115 may be dynamically varied (e.g., switchably changing the length of the flip-flop chain and thus the duration of the PEND signal assertion) in accordance with the commanded operation, thus effecting variable duration of the internal clock enable signal assertion according to the number of internal timing edges needed to carry out a given command. As shown in FIG. 1C, the latching of the internal clock-enable signal for the duration of the PEND signal enables generation of a command clock (CK-CA) to enable clocking of the command/address pipeline (including, for example, flip-flops 135 and 149) as well as read and write clocks (only CK-WR being shown) in the manner described above. Thus, by both synthesizing a chip-select signal and latching an internal clock enable signal in response to a chip-enable pulse, the chip-enable logic within memory component 101 emulates the multi-bit control mode, enabling the command/address reception and read and write data transfer operations described above.

FIGS. 2A-2C illustrate an exemplary implementation of a mode register that may be included within the merged-control memory component of FIG. 1A and exemplary management of memory refresh and power-state modes within the memory component. Referring first to FIG. 2A, mode register 240 (which may be formed by multiple separately selectable registers) includes a chip-select mode field 241 ("CS Mode"), refresh mode field 243 ("Ref Mode") and power mode field 245 ("Pwr Mode"). In the implementation shown, chip-select mode field 241 holds a single-bit chip-select mode value that may be programmed (e.g., in response to a programming instruction from a control component) to either a logic '0' state or a logic '1' state to establish the above-described multi-bit control mode ("Multi-Bit Control (CKE+CS)") or merged control mode ("Merged Control (CE)"), respectively, within the host memory component. In one embodiment, for example, the value programmed within the CS mode field is provided as the CS mode signal to logic gate 123 and multiplexer 133 within merged control memory component 101 of FIG. 1A.

Still referring to FIG. 2A, the refresh mode field 243 is a single-bit field that may be programmed to a logic '1' state to initiate self-initiated refresh ("self-refresh") operations within the host memory component, and either programmed or self-cleared to a logic '0' state to establish auto-refresh operations ("auto-refresh") within the memory component. When in self-refresh mode, refresh timing logic within the memory component initiates a periodic or occasional refresh operation to refresh content stored within the memory core and thus prevent undesired data loss (e.g., performing a row activation operation within a dynamic random access memory (DRAM) component, a memory read and re-program operation within a Flash memory component, or any other type of read and write-back, re-programming or data refresh operation). By contrast, in auto-refresh mode, the memory component executes refresh operations in response to externally supplied refresh commands.

In one embodiment, transitions between auto-refresh and self-refresh modes are effected differently according to the chip-select mode of the memory component. When in multi-bit control mode, for example, transitions of the clock-enable signal initiate transition into and out of self-refresh mode (i.e., from auto-refresh to self-refresh, and from self-refresh to auto-refresh, respectively), with the refresh mode field within the register being ignored (and possibly used for other purposes). In one implementation, for instance, a low-to-high transition of the clock-enable signal—indicating that the memory component is being awoken for purposes of command receipt—may effect a transition from self-refresh mode to auto-refresh mode, and a high-to-low transition of the clock-enable signal (conversely indicating that the memory component is being powered down and thus will not receive refresh commands for an indeterminate period of time) may effect transition from auto-refresh mode to self-refresh mode.

In merged-control mode, the chip-enable signal is pulsed for one or more clock cycles to effect chip selection over a command/address transmission interval and thus, in contrast to a conventional clock-enable signal, is not held high indefinitely to indicate a clock-enabled mode, nor transitioned to a low state to effect entry into a clock-disabled mode. In one embodiment, the lack of an external signal edge to mark entry into the clock-disabled state (and thus lack of an external signal edge to trigger entry into self-refresh mode and reduced-power state) is countered by provision of refresh mode field 243 and power mode field 245 within mode register 240. More specifically, as shown in FIG. 2B, a memory component initially operating in auto-refresh mode (i.e., memory component performs refresh operation in response to refresh command from control component) transitions to self-refresh mode in response to a mode register programming operation 251 in which the mode register is programmed with a value indicating self-refresh mode (i.e., the refresh mode bit is programmed to '1'). Thereafter, the memory component remains in self-refresh mode (e.g., performing refresh operations in response to an internal timer) until being explicitly re-programmed to auto-refresh mode (i.e., receiving a mode register programming instruction setting the refresh mode bit to '0') or until being implicitly restored to auto-refresh mode through assertion of the chip-enable signal. In the latter case, exemplified by affirmative determination at decision 253, decode logic circuitry within the memory component may respond to chip-enable signal assertion (detected, for example, by virtue of synthesized chip-select signal assertion as described above) by clearing the refresh mode bit within mode register 240, thus restoring the memory component to auto-refresh mode as shown at 255 in response to the implicit instruction to do so. The control component may be designed (or configured) to assume that raising the chip-enable signal will restore a self-refreshing memory component to auto-refresh mode, obliging the control component to issue timely refresh instructions thereafter.

In one embodiment, transitions between reduced and active power-modes mirrors the transitions between self-refresh and auto-refresh modes. That is, when a memory component is in multi-bit control mode, falling and rising signal transitions at the clock-enable input (CKE) effects a transition into and out of reduced-power (e.g., clock-disabled) power state, while in merged control mode, the power-mode field 245 within mode register 240 of the memory component is programmed (e.g., to '0') to effect entry into reduced-power state ("Power Down") and assertion of a chip-enable signal (or explicit re-programming of the power-mode field) effects exit from the reduced-power state ("Power On"). This operation is shown, for example, in FIG. 2C, demonstrating memory component transition from active power mode to reduced power mode following execution of a mode register programming operation at 261 that sets the power mode bit to '0', and exit from reduced power mode at 265 (e.g., self-clearing the power-mode bit) upon detecting assertion of the chip-enable signal at 263.

Reflecting on FIGS. 2A-2C, while mode control operations relating to refresh and power state have been described, other mode transitions or operational changes may be explicitly and implicitly instructed in merged control mode. For example, other control fields within mode register 240 (or other configuration circuitry) may be programmed to establish memory component operating modes and/or events otherwise controlled through assertion of a clock-enable signal, and assertion of the chip-enable signal may effect a transition to a prior operating mode.

FIGS. 3A and 3B illustrate embodiments of respective memory systems 275 and 295 having components capable of operating in either multi-bit control mode or merged control mode. More specifically, in the embodiment of FIG. 3A, which illustrates a multi-bit control mode configuration, either control component 277 ("CTRL") or memory components 280 (or both) may be alternatively configured for merged control operation. By contrast, FIG. 3B illustrates a merged control configuration, but either control component 297 ("CTRL") or memory components 300 (or both) may alternatively configured for multi-bit control operation. In alternative embodiments, control component 297 and/or memory components 300 of FIG. 3B may be dedicated to merged control operation (i.e., memory components that include circuitry to effect merged control operation but lack the spare pads and chip-select mode options discussed above).

In the exemplary multi-bit control configuration of FIG. 3A, two ranks of eighteen memory components 280 are disposed on respective memory modules 279a and 279b, so that a total of 36 memory components are coupled to control component 277. Each of the memory components 280 within a given rank is coupled to a respective set of six data-related signal lines including four single-ended data links ("18x4 DQ") and a differential data strobe link ("18x2 DQS"), and each data-related signal line is extends from the data interface ("DQ") of control component 277 to two memory components 280 (i.e., one memory component in each of the two memory modules 279a/279b) in a point-to-multiple point ("P-nP") interconnect topology. Accordingly, a total of 108 data-related signal lines ("Primary P-nP data buses," including 18 sets of four DQ lines ("18x4 DQ") and 18 sets of two DQS lines ("18x2 DQS")) are coupled to each rank of memory devices 280. All memory components 280 are coupled to a common set of twenty control lines, including 18 single-ended command/address links ("18 CA") and a differential clock link ("2 CK"), and each rank of eighteen memory components is coupled to a respective chip select line ("CS") and a respective clock-enable line ("CKE"), so that twenty-two control lines are provided per memory module (i.e., 18 CA, 2CK, CS and CKE, collectively shown at 285). Accordingly, because there are two memory ranks, a total of 24 control signals ("Primary P-nP CA bus," including 18 CA lines, 2 CK lines, 2 CS lines and 2 CKE lines) are output from the control/command/address interface ("CA") of control component 277, including 20 signals that are coupled in common to all memory components 280 in memory system 275 and two pairs of rank-specific control lines to convey CS/CKE signals to each memory rank. Though a fly-by control interconnect topology is shown (i.e., on-module control signal lines 285 routed such that a signal from the controller propagates past each memory component 280 of a given rank in sequence before reaching a link termination element 286), T-type interconnect topologies, star interconnect topologies or any other interconnect arrangement may be used in alternative embodiments. Also, the CA bus is designated "@ half data rate" in FIG. 3A to indicate that, in the embodiment shown, command/address information is conveyed one-bit per CK cycle per CA signal line, whereas the data buses are designated "@full data rate" to indicate that data signals are conveyed two bits per DQS transition (i.e., one bit per falling DQS edge and one bit per rising DQS edge) per DQ signal line. These same designations apply in FIG. 3B, though, as explained below, alternative timing arrangements may apply in either embodiment.

In the merged control configuration of system 295 (FIG. 3B), each CS/CKE signal pair is merged into a single chip-enable signal ("CE"), halving the number of control lines dedicated to each rank of memory devices 300 (i.e., merged-control memory devices) and thus doubling the number of memory ranks that can be controlled with the same control line count (i.e., from two ranks 279a and 279b in FIG. 3A to four ranks 299a-299d in the exemplary configuration of FIG. 3B). The data-related signals and remaining control signals are coupled as described in reference to FIG. 3A (i.e., 302/303 coupled in same manner as 282/283 and remainder of control signals 304/305 coupled in same manner as remainder of control signals 282/284) so that the number of on-module control lines is reduced from 22 to 21 as shown at 305. Thus, the capacity of memory system 295 is doubled relative to system 275 without increasing the number of interconnects (or pins) required at control component 297. Note that, except for repurposing the two CS and two CKE control signal lines shown in FIG. 3A (i.e., "2 CS, 2 CKE") as the four CE lines shown in FIG. 3B ("4 CE), the signal/bus names and legends shown in FIG. 3B have the meaning discussed above with respect to FIG. 3A.

FIG. 3C illustrates an exemplary sequence of operations that may be carried out within a control component that supports both multi-bit control and merged control operation. At 315, the control component reads configuration information within a serial presence detect (SPD) memory or other configuration data source to determine whether attached memory rank(s) support merged control of clock-enable and chip-selection functions and, if so, whether mode programming is required within the attached memory ranks. If the attached memory components do not support merged-control (i.e., require separate clock-enable and chip-select signals and thus yield a negative determination at decision 317), the control component configures its control signal drivers to provide multi-bit control at 319 and thus respective sets of clock-enable and chip-select signals to each attached memory rank. If the configuration information indicates that merged control is supported by default (i.e., the attached memory components either power up in merged control mode or support merged control mode exclusively, in either case yielding a negative determination at decision block 321), the control component self-configures for merged control operation at 327, setting its control signal drivers to output chip-enable signals according to the protocol shown, for example, in FIG. 1C, instead of clock-enable/chip-select signal pairs. If the configuration information indicates that the attached memory components or any subset thereof require configuration to operate in merged control mode (i.e., affirmative determination at 321), the control component issues mode register programming commands and operands to configurable ranks of memory components at 325 to configure those memory components for merged-control operation. Where such configuration operations are effected through the command interface (i.e., CA signal path, as opposed to a separate configuration interface such as a serial input/output (I/O) port), the control component may issue separate clock-enable and chip-select signals to the configurable memory components to enable those components to receive mode register programming commands and parameters, thus configuring the memory components for merged control operation through multi-bit control. After configuring memory components for merged control operation at 325, the control component self-configures its input/output (I/O) interface for merged control operation at 327.

FIG. 4A illustrates an embodiment of a merged-control memory component 350 having chip-enable logic 351 that generates a sequence of pipeline interval signals in response to chip-enable signal assertion, thus effecting a timing pipeline that is applied to generate exactly or approximately the number internal clock pulses needed to receive and execute an incoming command. Signal and circuit component names and legends (e.g., "differential, CE, CS, pad, bit-width indicators (i.e., circled numerals overlaying selected signal lines), etc.) have the meanings described above unless otherwise stated—a naming convention that applies generally to the accompanying drawings. As shown, chip-enable logic 351 includes clock pipeline logic 353 that receives a chip-enable and clock signal via pads/receivers 355/356 and 357/358, respectively. Clock pipeline logic 353 may also include circuitry to enable operation in multi-bit control mode (i.e., according to a chip-select mode programmed within configuration register 370 ("Config Reg") as generally discussed above in reference to FIG. 2A), receiving a chip-select signal via pad 355 and receiver 356, and a clock-enable signal via pad 359 and receiver 360. Alternatively or additionally, a control signal received via pad 359 and receiver 360 may be used to control deep power down operations, including disabling receivers 356 and 358 (among others) within memory component 350.

Continuing with FIG. 4A, clock pipeline logic 353 generates a synthesized chip-select signal (CS-SYN) which is provided, via flip-flop 135, to decode logic circuit 150 within memory core 102 to enable decoding of a command/address value received via pads 145 and receivers 147 and forwarded via flip-flop 149. As in the internal clock generation logic of FIG. 1A, chip-enable logic 351 generates internal read and write clocks (CK-RD and CK-WR) which are provided to read and write data I/O logic as described in reference to FIG. 1A, as well as a command address clock to enable capture of the synthesized chip-select signal and the incoming command/address value within flip-flops 135 and 149, respectively. That is, chip-enable logic 351 includes AND gates 155, 365 and 367 to pass a clock signal corresponding to the incoming clock signal (e.g., a gated version of the incoming clock signal) to respective clock trees 156, 158 and 160 when corresponding control signals are raised by clock pipeline logic 353. In contrast to the embodiment of FIG. 1A in which the command clock (CK-CA) is enabled by internal clock-enable signal CKEi and thus remains enabled throughout the duration of a given memory access operation, clock pipeline logic 353 generates an additional enable signal, EnCA, which is applied to gate command clock generation, limiting the number of command clock pulses to the number needed for command/address reception and decoding. This operation is shown by the exemplary write-access and read-access timing diagrams of FIGS. 4B and 4C, respectively ("Pipelined Clock—Write Access" and "Pipelined Clock—Read Access"), as the command/address clock is limited to the two pulses at 371 and 373 (i.e., two rising edges, though more or fewer may be generated in alternative embodiments) instead of continuing to oscillate throughout the duration of the write and read operations (i.e., see "Refrain from generating unneeded clock edges" in FIGS. 4A and 4B). The timing of the chip-enable signal generation, synthesized-chip-select generation, command/address sampling, read and write clock generation and data and data strobe transfer remains generally as shown in FIG. 1C (i.e., except that FIG. 4C shows a read-access transaction in response to read command "RD A" and thus a read data and read data strobe transmission instead of a write data and write data strobe reception).

Figure 5A:
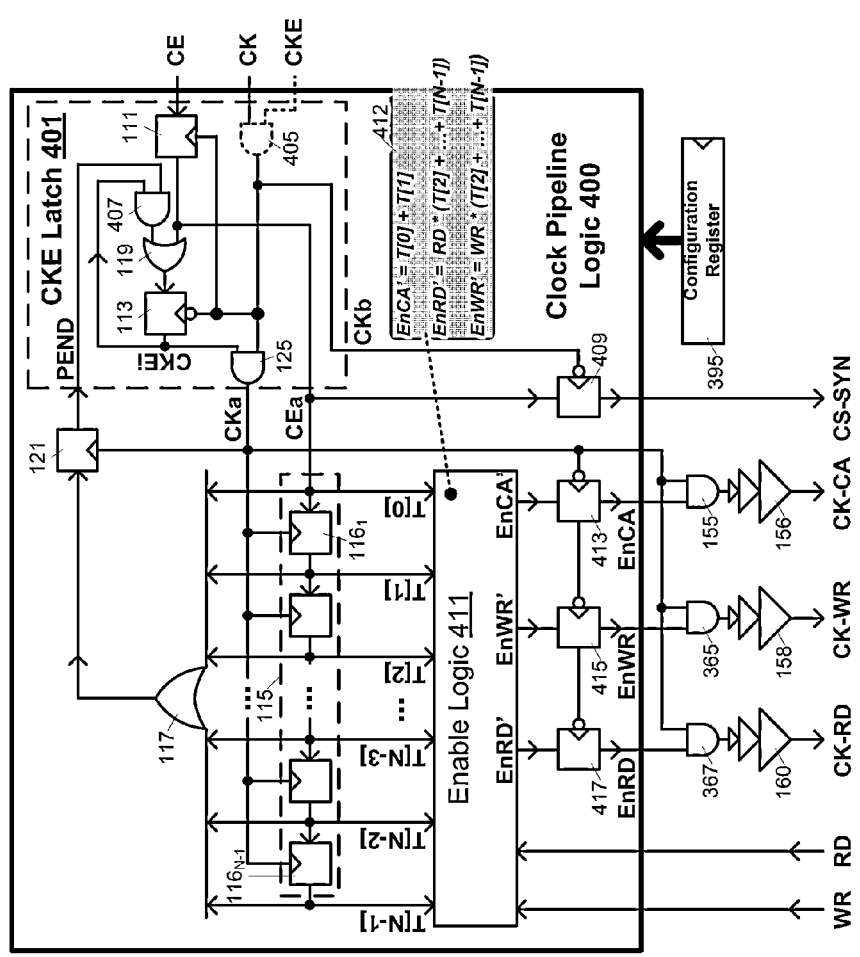
FIG. 5A illustrates an embodiment of a clock pipeline logic circuit that may be used to implement the clock pipeline logic within the memory component of FIG. 4A.

FIG. 5A illustrates an embodiment of a clock pipeline logic circuit 400 that may be used to implement the clock pipeline logic 353 within the memory component of FIG. 4A. As shown, clock pipeline logic 400 includes flip-flops 111, 113, $116_1$-$116_{N-1}$ (i.e., forming shift register 115) and 121, and logic gates 119, 125 and 117, all of which function as described in reference to FIG. 1A to latch an internal clock-enable signal CKEi for a predetermined number of clock (CK) cycles in response to a chip-enable signal assertion. More specifically, referring to FIGS. 5A and 5B, assertion of chip-enable signal at 419 is captured within flip-flop 111 in response to rising clock edge 418 and then, via OR gate 119, within flip-flop 113 in response to the ensuing falling clock edge 419, thus raising the internal clock-enable signal, CKEi. The output of flip-flop 111 is also supplied to shift register 115, with the shift register input and the output of each constituent flip-flop $116_1$-$116_{N-1}$ coupled to a respective input of OR gate 117. Accordingly, the output of OR gate 117 remains high for a predetermined number of clock cycles according to the number (N) of flip-flops within the shift register. As in the embodiment of FIG. 1A, the output of OR gate 117 is captured within flip-flop 121 in response to a rising clock edge (i.e., rising edge of CKa signal) to produce a clock-synchronized "PEND" signal which is supplied to an input of AND gate 407 to latch the high state of the internal clock-enable signal within flip-flop 113 for the predetermined number of clock cycles established by the shift register. Through this CKEi latching operation, internal clock signal, CKa, is enabled to continue toggling for a number of clock cycles (i.e., N clock cycles) after the chip-enable signal is deasserted. The combinatorial and state logic that latch the internal clock-enable signal and enable continued toggling of the internal clock signal (i.e., logic gates 407, 119 and 125, optional logic gate 405, and flip-flops 111 and 113) are thus referred to collectively herein as a clock-enable latch circuit 401 ("CKE Latch"). Though not specifically shown, AND gate 407 may additionally receive a CS-Mode signal to enable and disable latching of the internal clock enable signal according to the memory component operating mode (i.e., enabling selection between merged-control or multi-bit control).

Still referring to FIGS. 5A and 5B, the output of flip-flop 111 constitutes a clock-synchronized chip-enable signal, "CEa," which is latched within flip-flop 409 in response to a falling edge of internal clock signal CKb to yield a synthesized chip-select signal (CS-SYN) that is one-clock cycle delayed from the incoming chip-enable signal as shown at 420 of FIG. 5B, thus mimicking the timing of an externally supplied chip-select signal. As the chip-enable signal pulse propagates from flip-flop 111 through the constituent flip-flops $116_0$-$116_{N-1}$ of shift register 115 (which may be viewed as including flip-flop 111), the outputs of those flip-flops go high for respective clock intervals; intervals referred to herein as "pipeline intervals" as each defines a temporal unit within an overall command-execution pipeline. As shown, the pipeline interval signals (T[0], T[1], . . . , T[N−1]) are supplied, together with read-enable and write-enable signals ("RD" and "WR") from the decode logic circuit (i.e., element 150 of FIG. 4A), to enable logic circuit 411. Enable logic circuit 411, in turn, outputs control signals (EnRd', EnWr' and EnCA') to enable toggling of internal read, write and command clock signals (CK-RD, CK-WR and CK-CA), respectively, during predetermined intervals and in accordance with the operation being performed. In the embodiment shown, for example, enable logic 411 includes combinatorial logic to assert signal EnCA' during the two clock cycles that follow reception of the chip-enable signal (i.e., at clock edge 418) by logically ORing the outputs of flip-flops 111 and $116_1$ (i.e., ORing pipeline interval signals T[0] and T[1] as indicated at 412 by the expression "EnCA'=T[0]+T[1]") and to deassert EnCA' thereafter. As shown, control signal EnCA' is captured within flip-flop 413 in response to the falling edge of CKa to produce synchronized control signal EnCA which is supplied, in turn, to an input of AND gate 155 to enable generation of the internal command clock within clock tree 156 (i.e., enabling passage of CKa to the clock tree input when EnCA is high). Thus, enable logic 411 serves to "pick off" selected pipeline intervals during which an internal clock signal is to be enabled and thereby provide precise control over the number and timing of the internal clock pulses. In the example shown, the synchronized control signal EnCA is asserted for two clock cycles as shown at 421 to enable toggling of the internal command clock, CK-CA, during the two pipeline intervals that follow assertion of pipeline interval signals T[0] and T[1].

As shown at 412, enable logic 411 also includes combinatorial logic to enable toggling of the read and write clocks for selected pipeline intervals during read and write operations, respectively. That is, when the write-enable signal (WR) is asserted (indicating a write operation), enable-logic 411 asserts combinatorial write-enable signal EnWR' during clock pipeline intervals T[2] through T[N−1] (i.e., ENWR'=WR*(T[2]+ . . . +T[N−1]), where '*' designates a logic AND operation and '+' designates a logic OR operation), thus yielding assertion of synchronized write-clock enable signal, EnWR, at the output of flip-flop 415. The synchronized write-clock enable signal is supplied, in turn, to AND gate 365, enabling internal clock signal CKa to be passed to write clock tree 158 and thereby enabling oscillation the write clock signal, CK-WR, during the intervals shown (i.e., a clock pulse following each pipeline interval in which EnWR' is asserted). Similarly, during a read operation, the read-enable signal (RD) is asserted to enable generation of a combinatorial read-enable signal (EnRD') during clock pipeline intervals T[2]-T[N−1] (i.e., ENRD'=RD*(T[2]+ . . . +T[N−1]), thus yielding assertion of synchronized read-clock enable signal, EnRD, at the output of flip-flop 417. Though not shown by timing waveforms in FIG. 5B, the synchronized read-clock enable signal is supplied to AND gate 367, enabling internal clock signal to be passed to read clock tree 167 and thereby enabling oscillation of the read clock signal, CK-RD, with generally the same timing as shown in FIG. 5B for CK-WR.

Though substantially identical logic expressions are shown at 412 for the read and write clock enable signals (i.e., respective read- and write-enable signals are applied, but oscillation is otherwise enabled during the same clock pipeline intervals), different clock pipeline interval signals may be applied to enable the two clock enable signals in alternative embodiments or configurations. In one embodiment, configuration register 395 ("Configuration Register") of FIG. 5A may include one or more programmable fields that control which of the clock pipeline interval signals are applied to produce read and write clock-enable signals, as well as programmable fields that control the chip-select mode, CE-to-CA delay (i.e., $t_{CE-CA}$ as shown in FIGS. 4B and 4C) and operating modes or parameters discussed herein.

Figure 6B:
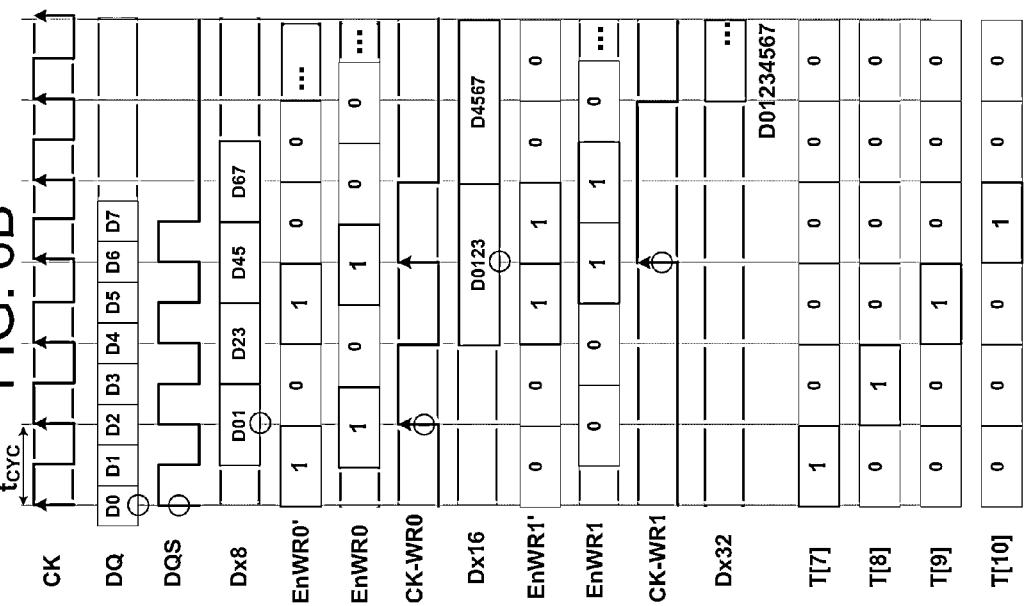
FIG. 6B presents an exemplary timing diagram corresponding to operations within the merged-control memory component of FIG. 6A.
Figure 6A:
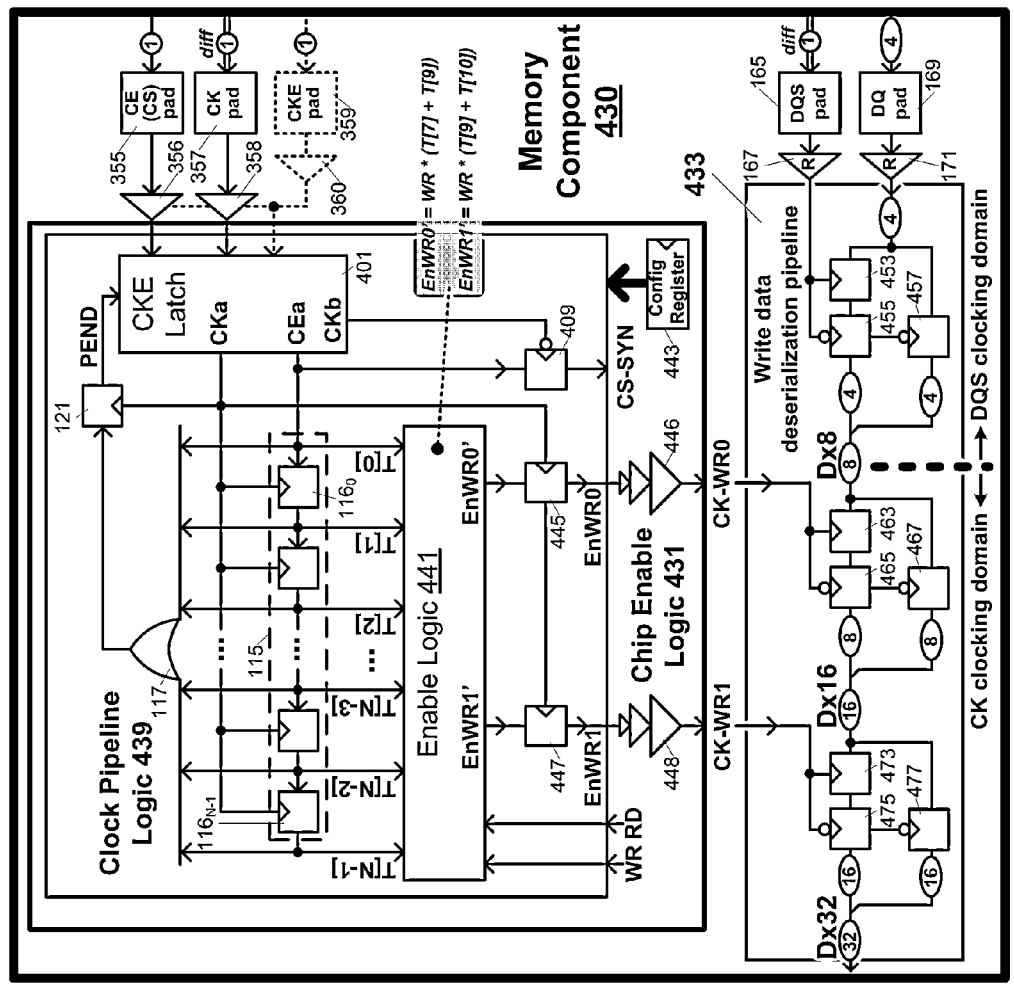
FIG. 6A illustrates an alternative embodiment of a merged-control memory component that includes chip-enable logic together with a write data deserialization pipeline.

FIG. 6A illustrates an alternative embodiment of a merged-control memory component 430 that includes chip-enable logic 431 together with a write data deserialization pipeline 433. As with chip-enable logic embodiments described above, chip-enable logic 431 is coupled to receive chip-enable and clock signals via pad/receiver 355/356 and 357/358, respectively (and may include an additional pad/receiver 359/360 to support multi-bit mode and/or additional power-down modes as discussed above) and includes clock pipeline logic 439, configuration register 443 and clock trees 446 and 448. Memory component 430 and chip-enable logic 431 include additional circuitry not shown, including a memory core which sources read and write enable signals (RD and WR), a read data serialization pipeline and a command pipeline, as well as circuitry to generate internal clock signals for operations within those pipelines.

In the embodiment shown, clock pipeline logic 439 includes clock-enable latch 401, shift register 115, OR gate 117, and flip-flops 121 and 409 which operate generally as discussed above to generate pipeline interval signals (T[0]-T[N-1]) in response to an incoming chip-enable pulse, enabling oscillation of internal clock signal CKa until the last of the pipeline interval signals is asserted, and latching a synthesized chip-select signal a predetermined number of clock cycles after receipt of the chip-enable signal. Clock pipeline logic 439 also includes an enable logic circuit 441 that operates generally as described in reference to FIG. 5A to produce a set of clock-enable signals, including a command-clock enable signal and read-clock enable signal (not specifically shown) as well as a pair of multi-rate write-clock enable signals, EnWR0' and EnWR1' (e.g., "EnWR0'=WR*(T[7]+T[9])" and "EnWR1'=WR*(T[9]+T[10])"). More specifically, when an incoming command indicates a memory write operation (i.e., write-enable signal (WR) is asserted by decode logic), enable logic circuit 441 asserts multi-rate write-clock enable signals, EnWR0' and EnWR1' at respective times to enable generation of write-pipeline clock signals, CK-WR0 and CK-WR1, (i.e., via registers 445 and 447, which generate synchronized enable signals EnWR0 and EnWR1, respectively, and clock trees 446 and 448) having different clock pulse widths corresponding to the different data deserialization rates applied within respective stages of the write data deserialization pipeline 433. Referring to the example shown in FIG. 6B, for instance, an initial set of four bits of write data (D0) received via DQ pads 169 and receivers 171 is latched within register 453 in response to a rising edge of a data strobe signal, DQS (i.e., received via pad 165 and receiver 167), and then transferred to register 455 in response to the ensuing falling edge of the data strobe signal. The same falling edge of the data strobe signal that latches D0 within register 455 latches a subsequently received set of four bits (D1) within register 457, thus parallelizing the two sets of four bits received in response to respective edges of the strobe signal (which, in one embodiment, toggles at the clock frequency during data transmission such that two sets of four bits are received per cycle of the clock signal) into an 8-bit value at the "Dx8" output of registers 455 and 457. The eight-bit Dx8 value, which crosses between the DQS and CK clocking domains ("DQS clocking domain" and "CK clocking domain") is designated "D01" in FIG. 6B.

Registers 453, 455 and 457 effectively form a "first stage" of the write-data deserialization pipeline, with corresponding register sets 463/465/467 and 473/475/477 forming second and third stages of the pipeline. Thus, in terms of pipeline stages, the Dx8 value output from the first write-data pipeline stage (i.e., 8-bit value D01 initially, followed by D23, D45 and then D67) is supplied to a second write-data pipeline stage where further deserialization occurs.

The second write-data pipeline stage operates in generally the same manner as the first to parallelize two eight-bit inputs (i.e., eight-bit values D01 and D23 output sequentially from the first pipeline stage at half the input data rate) into a sixteen-bit output Dx16, generating a new sixteen-bit output every two clock cycles (i.e., first D0123 and then D4567). In the particular embodiment shown, the overall write-data value is assumed to include 32 bits (i.e., a burst of eight 4-bit write-data transmissions), so that a total of two sixteen-bit outputs are generated by the second stage of the write-data pipeline (D0123 and D4567), with the second of the two sixteen-bit values being output two clock cycles after the first. To time capture of the incoming eight-bit values within registers 463 and 467 in successive clock cycles without generating unnecessary timing edges, enable logic 441 toggles second-stage write-clock enable signal, EnWR0', in successive clock cycles, raising and then lowering EnWR0' during pipeline intervals T[7] and T[8], respectively, and then raising and lowering EnWR0' again during pipeline intervals T[9] and T[10], thereby producing a second stage write clock signal CK-WR0 that pulses twice at appropriate times relative to the incoming write data. That is, CK-WR0 goes high in response to the rising edge of the clock signal that follows capture of D01 within first-stage registers 455 and 457, thus capturing D01 within register 463, and then goes low in response to the rising edge of the clock signal that follows capture of D23 within first stage registers 455 and 457, thus transferring D01 to register 465 and D23 to register 467 to establish 16-bit value D0123 at the Dx16 output. CK-WR0 is raised and lowered again in response to the two ensuing rising clock edges to establish D4567 at the Dx16 output as shown.

The third write-data pipeline stage operates in generally the same manner as the preceding stages to parallelize two sixteen-bit inputs (i.e., 16-bit values D0123 and D4567 output sequentially from the second pipeline stage at one-fourth the input data rate) into a 32-bit output Dx32 to be delivered to the memory core. In the particular embodiment shown, the overall write-data value is assumed to include 32 bits (i.e., a burst of eight 4-bit write-data transmissions, D0-D7), so that a total of two sixteen-bit outputs are generated by the second stage of the write-data pipeline (D0123 and D4567), with the second of the two sixteen-bit values being output two clock cycles after the first. To time capture of the two sixteen-bit values within registers 473 and 477 without generating unnecessary timing edges, enable logic 441 raises and then lowers third-stage write-clock enable signal, EnWR1', during pipeline intervals T[9] and T[10] to produce a third stage write clock signal CK-WR1 that goes high and then low at appropriate times relative to the incoming Dx16 data values. That is, CK-WR1 goes high in response to the rising edge of the clock signal that follows capture of D0123 within second-stage registers 465 and 467, thus capturing D0123 within register 473, and then goes low in response to the rising edge of the clock signal that follows capture of D4567 within second stage registers 465 and 467, thus transferring D1234 to register 475 and D4567 to register 477 to establish 32-bit write data value D1234567 at the Dx32 output.

Reflecting on the operation shown in FIGS. 6A and 6B, it can be seen that the second and third stage write clock signals (CK-WR1 and CK-WR2) transition only when necessary to capture data within pipeline registers—there are no surplus transitions of either signal and thus no unnecessary power consumption.

Figure 7A:
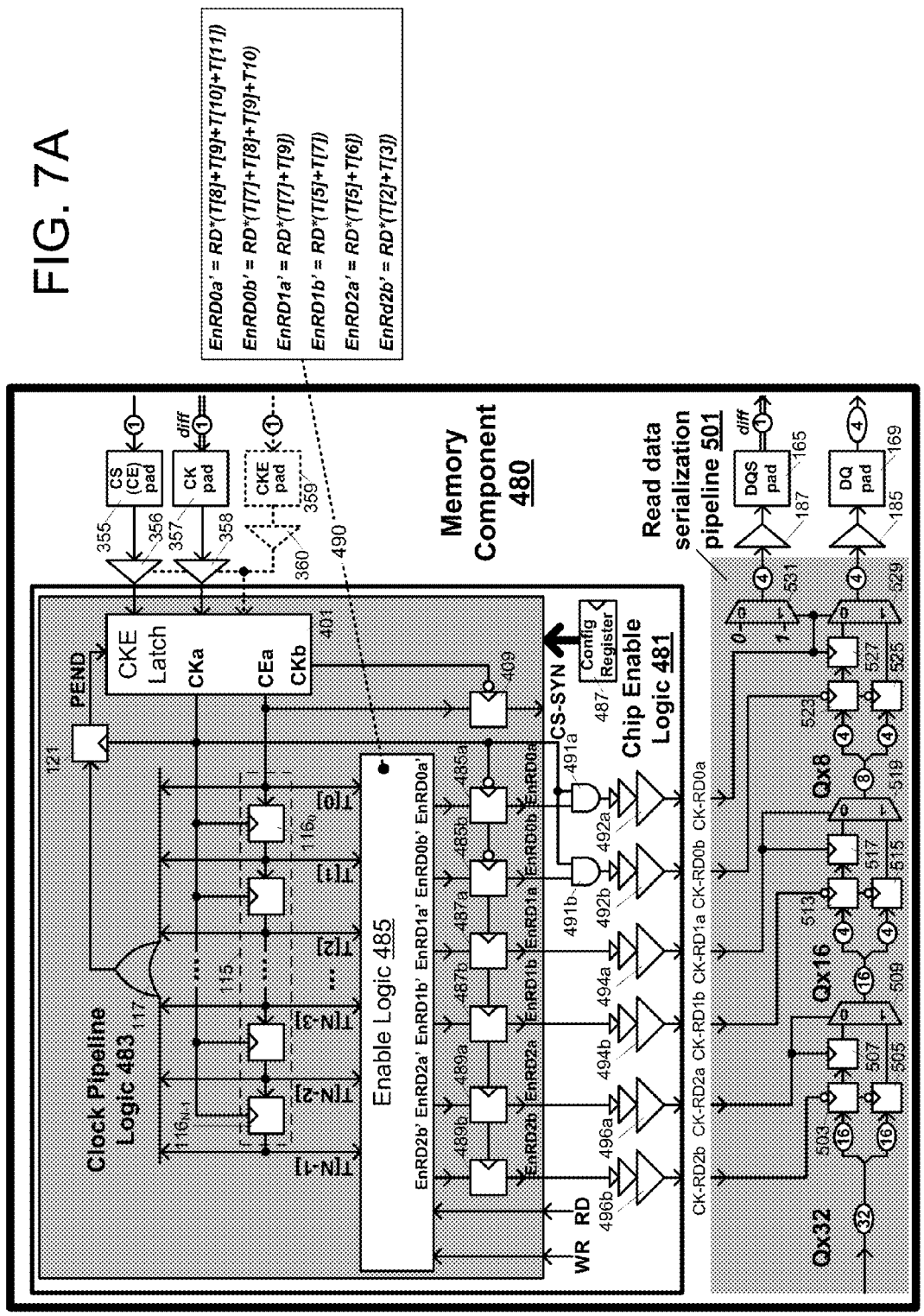
FIG. 7A illustrates an alternative embodiment of a merged-control memory component that includes chip-enable logic together with a read data serialization pipeline.

FIG. 7A illustrates an alternative embodiment of a memory component 480 that includes chip-enable logic 481 together with a read data serialization pipeline 501. As before, chip-enable logic 481 is coupled to receive chip-enable and clock signals via pads/receivers 355/356 and 357/358, respectively (and may include an additional pad/receiver 359/360 to support multi-bit mode and/or additional power-down modes as discussed above) and includes clock pipeline logic 483, configuration register 487 and synchronizing logic gates 491a and 491b, and clock trees 492a/492b, 494a/494b and 496a/496c. Memory component 480 and chip-enable logic 481 include additional circuitry not shown, including a memory core which sources read and write enable signals (RD and WR), a write data deserialization pipeline (e.g., as described above in reference to FIGS. 6A and 6B) and a command pipeline, as well as circuitry to generate internal clock signals for operations within those pipelines.

Figure 7B:
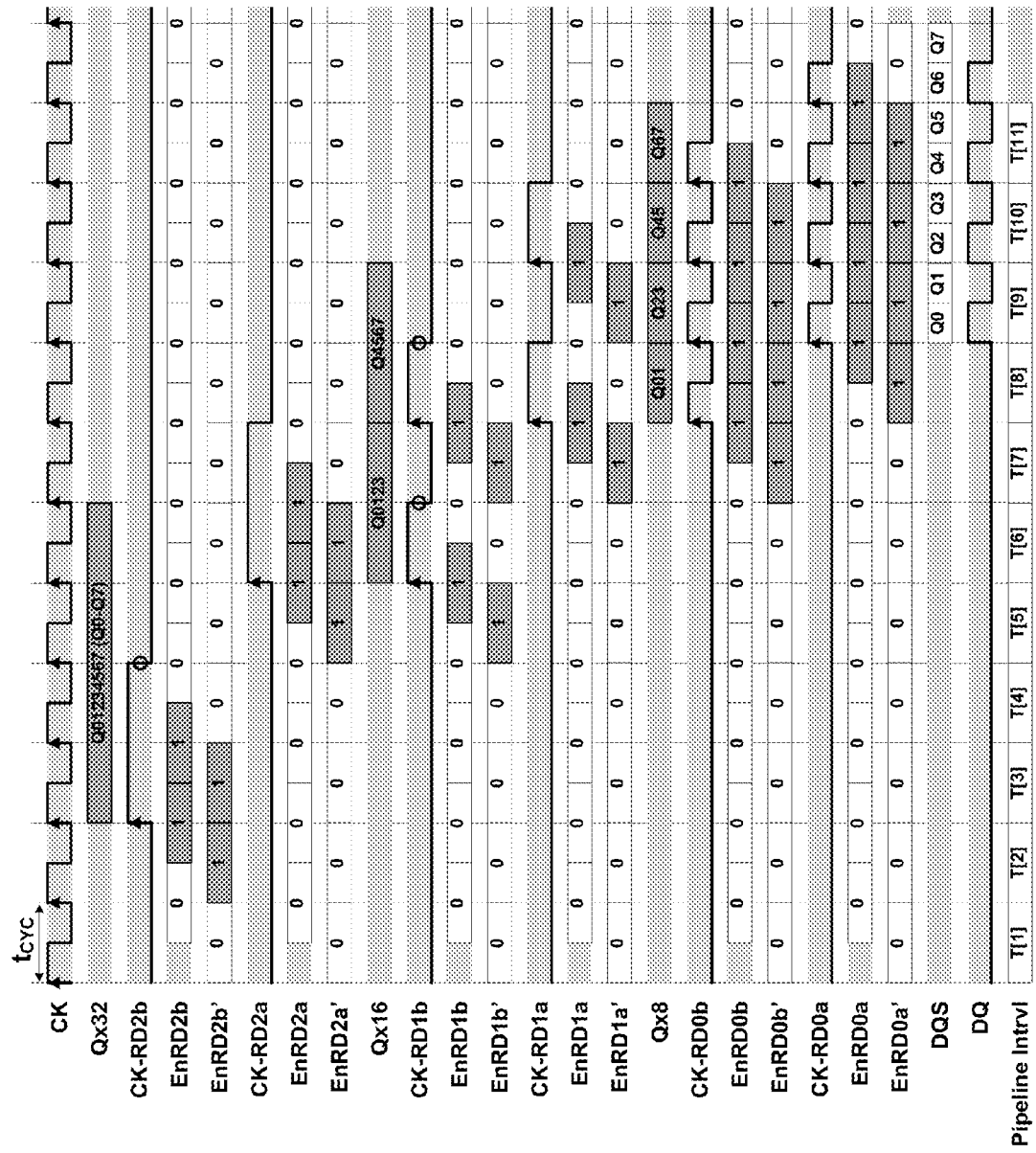
FIG. 7B presents an exemplary timing diagram corresponding to operations within the merged-control memory component of FIG. 7A.

In the embodiment shown, clock pipeline logic 483 includes clock latch circuitry 401, shift register 115, OR gate 117, and flip-flops 121 and 409 which operate generally as discussed above to receive generate pipeline interval signals (T[0]-T[N−1]) in response to an incoming chip-enable pulse (enabling oscillation of internal clock signal CKa until the last of the pipeline interval signals is asserted) and to latch a synthesized chip-select signal (CS-SYN) a predetermined number of clock cycles after receipt of the chip-enable signal. Clock pipeline logic 483 also includes an enable logic circuit 485 that operates generally as described in reference to FIG. 6A to produce a set of clock-enable signals, including a command-clock enable signal and one or more read-clock enable signals (not specifically shown) as well as a set of multi-rate read-clock enable signals, EnRD0a'/EnRD0b', EnRD1a'/EnRD1b' and EnRD2a'/EnRD2b'. More specifically, when an incoming command indicates a memory read operation (i.e., read-enable signal (RD) is asserted by decode logic), enable logic 485 asserts the multi-rate read-clock enable signals at respective times in accordance with the Boolean expressions shown at 490 to enable generation, via registers 485a/485b, 487a/487b and 489a/489b of synchronized enable signals EnRD0a/EnRD0b, EnRD1a/EnRD1b and EnRD2a/EnRD2b and thus corresponding read-pipeline clock signals (CK-RD0a/CK-RD0b, CK-RD1a/CK-RD1b and CK-RD2a/CK-RD2b) that are supplied to respective stages of the read data pipeline. Referring to FIG. 7B, for example (which shows signal names in accordance with FIG. 7A and pipeline intervals T[1]-T[11] ("Pipeline Intervl")), respective halves of 32-bit read data output Qx32 (i.e., eight 4-bit read data values Q0-Q7 or "Q01234567" received in parallel from the memory core) are latched within flip-flops 503 and 505 in response to a falling edge of clock CK-RD2b, with 16-bit half of that read data (i.e., Q0123), being subsequently loaded into flip-flop 507 in response to a rising edge of clock CK-RD2a. Multiplexer 509, which together with flip-flops 503,505 and 507 forms a first serialization stage of read data serialization pipeline 501, outputs the contents of flip-flop 507 (Q0123) while CLK-RD2a is high, and then outputs the contents of flip-flop 505 (Q4567) when CLK-RD2a goes low, thereby serializing the two 16-bit halves of the Qx32 read data value at the first-stage output (and second stage input), Qx16.

The two 16-bit values output from the first serialization stage are received one after another at the 16-bit input (Qx16) to a second serialization stage formed by flip-flops 513, 515 and 517, and multiplexer 519. The second serialization stage repeats the serialization operation of the first serialization stage in two instances, splitting each of the incoming sixteen bit values (i.e., Q0123 and Q4567) into a respective pair of eight bit values. More specifically, respective 8-bit halves of leading 16-bit read data value Q0123 (i.e., 8-bit values Q01 and Q23) are latched within flip-flops 513 and 515 in response to a falling edge of clock CK-RD1b, with data Q01 being subsequently loaded into flop-flop 517 in response to a rising edge of clock CK-RD1a. Multiplexer 519 outputs the contents of flip-flop 517 (Q01) while CLK-RD1a is high, then outputs the contents of flip-flop 515 (Q23) when CLK-RD1a goes low, thereby serializing the two 8-bit halves of the leading Qx16 read data value. The two halves of the trailing Qx16 read data value are serialized in the same way, being latched within flip-flops 513 and 515 in response to a second falling edge of CK-RD1b, with data Q45 being subsequently loaded into flip-flop 517 in response to a second rising edge of CK-RD1b Qx32 value are output to with 16-bits (Q0123). As with the leading 16-bit read data value, multiplexer 519 outputs the contents of flip-flop 517 (Q45) while CLK-RD1a is high, then outputs the contents of flip-flop 519 (Q67) when CLK-RD1a goes low.

The four 8-bit values output from the second serialization stage are received one after another at the 8-bit input (Qx8) to a third serialization stage formed by flip-flops 523, 525 and 527, and multiplexer 529. The third serialization stage repeats the serialization operation of the first two serialization stages in four instances, splitting each of the four incoming 8-bit values (i.e., Q01, Q23, Q45 and Q67) into a respective pair of four bit values for transmission on an external data path via output drivers 185 and pads 169. More specifically, respective 4-bit halves of leading 8-bit read data value Q01 (i.e., Q0 and Q1) are latched within flip-flops 523 and 525 in response to a falling edge of clock CK-RD0b, with Q0 being subsequently loaded into flip-flop 527 in response to a rising edge of clock CK-RD0a. Multiplexer 529 outputs the contents of flip-flop 527 (Q0) while CLK-RD0a is high, then outputs the contents of flip-flop 525 (Q1) when CLK-RD1a goes low, thereby serializing the two 4-bit halves of the leading Qx8 read data value. The two halves of each remaining Qx8 read data value are serialized in the same way in response to subsequent transitions of the CK-RD0b and CK-RD0a signals.

Still referring to memory component 480 and the corresponding timing diagram shown in FIG. 7B, it can be seen that the first, second and third stage read clock signals (CK-RD0a/CK-RD0b, CK-RD1a/CK-RD1b and CK-RD2a/CK-RD2b) transition only when necessary to capture data within pipeline registers. More specifically, third-stage read clock signals CK-RD0a and CK-RD0b are enabled to cycle four times (i.e., four clock pulses are generated) to generate the eight timing edges applied to produce the succession of eight 4-bit read data transmissions (i.e., 8x read-data burst). Similarly, second-stage read clock signals CK-RD1a and CK-RD1b are enabled to cycle twice (yielding two clock pulses) to generate the four timing edges applied to produce the four 8-bit inputs to the first stage of the serialization pipeline, and the first-stage read clock signals (CK-RD2a and CKRD2b) are enabled to cycle once (yielding a single pulse) to generate the two timing edges applied to produce the two 16-bit inputs to the second stage of the serialization pipeline. Accordingly, clock pipeline logic 483 enables generation of exactly the number of clock pulses needed to serialize the 32-bit read data value from the memory core into a sequence of eight 4-bit transmissions. As in the write-data pipeline described in reference to FIGS. 6A and 6B, there are no surplus clock pulses and thus no unnecessary power consumption.

Figure 8B:
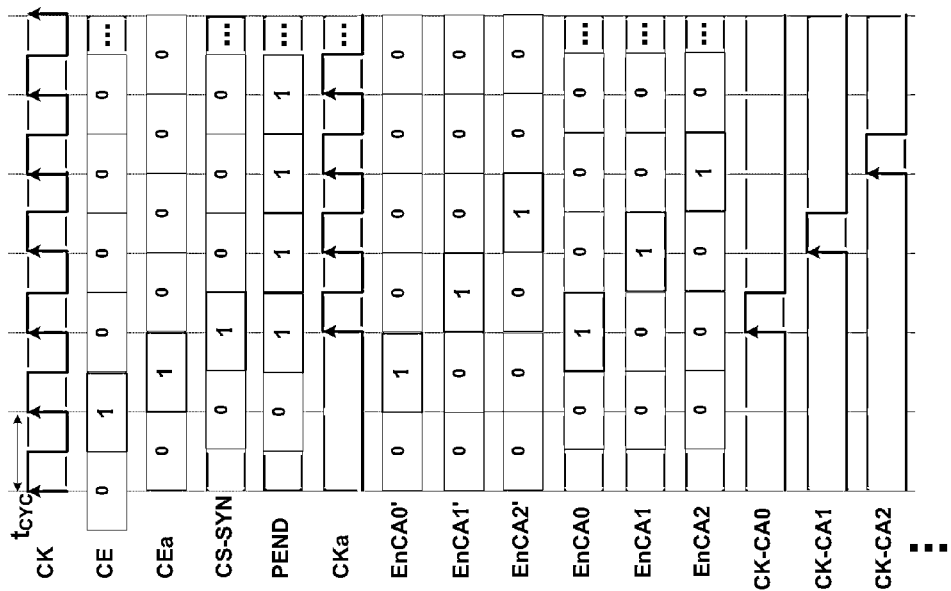
FIG. 8B presents an exemplary timing diagram corresponding to operations within the merged-control memory component of FIG. 8A.
Figure 8A:
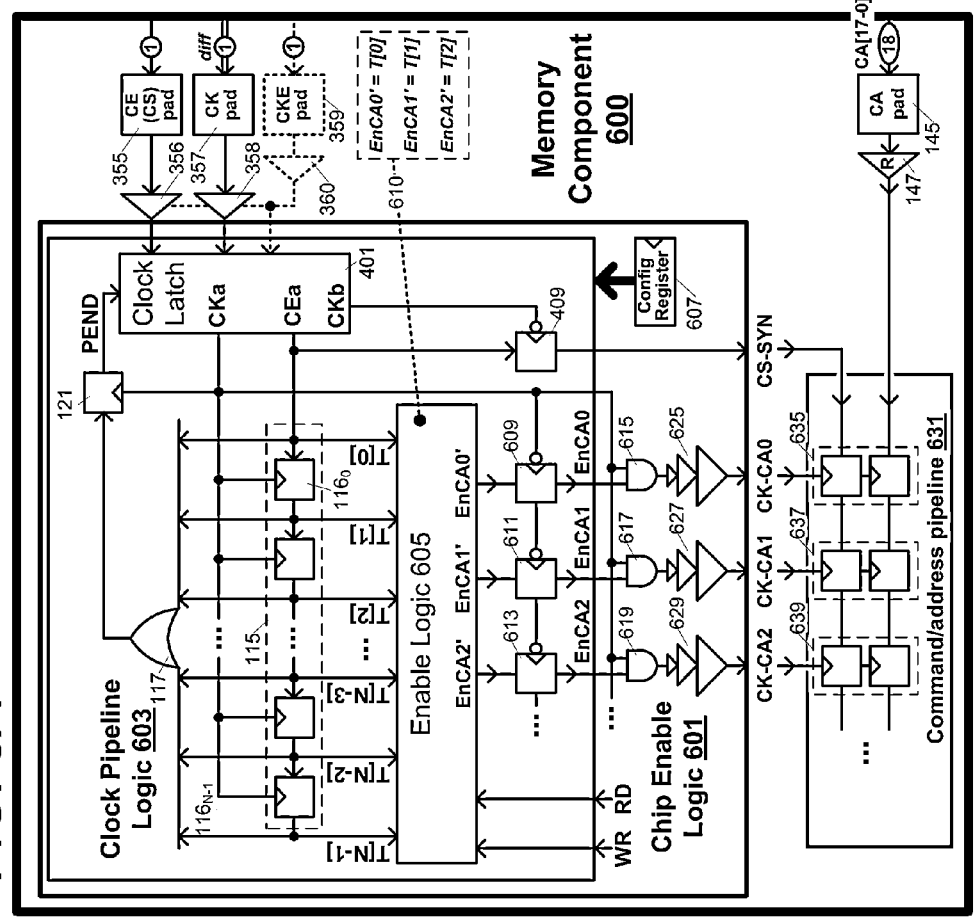
FIG. 8A illustrates another embodiment of a memory component that includes chip-enable logic together with a command/address pipeline.

FIG. 8A illustrates another embodiment of a memory component 600 that includes chip-enable logic 601 together with a command/address pipeline 631. As in the embodiments of FIGS. 6A and 7A, chip-enable logic 601 is coupled to receive chip-enable and clock signals via pads/receivers 355/356 and 357/358, respectively (and may include an additional pad/receiver 359/360 to support multi-bit mode and/or additional power-down modes as discussed above) and includes clock pipeline logic 603, configuration register 607, as well as synchronizing logic gates 615, 617 and 619, and command/address clock trees 625, 627 and 629 that provide clock pulses to command/address pipeline 631. Memory component 600 and chip-enable logic 601 include additional circuitry not shown, including a memory core which sources read and write enable signals (RD and WR), and write data deserialization and read data serialization pipelines (e.g., as described above in reference to FIGS. 6A/6B and 7A/7B), as well as circuitry to generate internal clock signals for operations within those pipelines.

In the embodiment shown, clock pipeline logic 603 includes clock latch circuitry 401, shift register 115, OR gate 117, and flip-flops 121 and 409 which operate generally as discussed above to generate clock pipeline interval signals (T[0]-T[N−1]) in response to an incoming chip-enable pulse (enabling oscillation of internal clock signal CKa until the last of the pipeline interval signals is asserted) and to latch a synthesized chip-select signal a predetermined number of clock cycles after receipt of the chip-enable signal. The clock pipeline logic also includes an enable logic circuit 605 that operates generally as described in reference to FIG. 6A to produce a set of clock-enable signals, including one or more read and write clock-enable signals (not specifically shown). As shown in FIG. 8B, the enable logic circuit 605 also generates a set of command clock-enable signals (EnCA0', EnCA1', EnCA2', etc.) that are asserted in sequential pipeline intervals (e.g., T[0], T[1], T[2], etc., as shown in the expressions at 610). The command clock-enable signals are synchronized with the falling edge of internal clock signal CKa in flip-flops 609, 611, 613, etc., producing a corresponding set of synchronized clock-enable signals, EnCA0, EnCA1, EnCA2, etc. The synchronized clock-enable signals are supplied to inputs of respective AND gates 615, 617, 619, etc., and thus gate internal clock signal CKa in a manner that yields respective command clock pulses (CK-CA0, CK-CA1, CK-CA2, etc.) one after another at the outputs of clock trees 625, 627, 629, etc. As shown, the command clock pulses are supplied to command/address pipeline 631 to clock an incoming command value and synthesized (or incoming) chip-select value through a sequence pipeline stages 635, 637, 639, etc. By clocking the constituent flip-flops within each command/address pipeline stage with a single pulse timed according to arrival of the command/address value at that stage, the incoming command/address value progresses through command/address pipeline 631 with precisely the required number of clock pulses, avoiding unnecessary timing edges and thus reducing power consumption relative to distribution of a common clock signal to all stages of the command pipeline. Though not specifically shown, the command/address and chip-select value captured at each pipeline stage (635, 637, 639, etc.) within command/address pipeline 631 may be output to other logic circuits (e.g., a decode logic circuit as described above) to effect state-specific and/or time-specific actions as necessary to complete the commanded operation.

Note that under the particular approach shown in FIG. 8A, the incoming command/address and chip-select values will remain resident in a given stage of the command pipeline even as those values are latched within downstream stages (i.e., progressively filling the CA pipeline until all stages contain the same CA and chip-select values instead of shifting the CA/CS values from stage to stage). In any pipeline stage for which this latch-and-hold operation produces an undesired consequence (e.g., signal latched at the output of a given CA pipeline stage causes power dissipation or enables repeated execution of an operation that is to be executed only once (or a finite number of times) per incoming command), any or all of the signals output from that pipeline stage may be ANDed with one or more of the command clock-enable signals (i.e., EnCA0', EnCA1', . . . and/or EnCA0, EnCA1, . . . ) to limit signal assertion to a desired interval.

FIGS. 9A and 9B illustrate speculative enablement of write and read clocks (CK-WR and CK-RD) within an alternative embodiment or configuration of a clock pipeline logic circuit. Referring first to FIG. 9A ("Write Access with Speculative WR Clock Enable"), instead of waiting for an incoming command/address value 651 to be decoded before enabling clock generation within either the read or write clock trees (i.e., according to the result of the command decode), read and write clocks are enabled immediately in response to receipt of a chip-enable signal (and thus begin toggling after time $t_{CS-CK}$) on the speculation that an incoming command will instruct either a read or write access. By speculatively enabling the read and write clocks in this way (i.e., as shown in the shaded region of FIG. 9A designated "Speculative enable of RD/WR Clocks (shortening write-access latency)"), timing delay otherwise incurred waiting for the read clock or write clock to stabilize at the clock tree output (i.e., the write-clock stabilization time, $t_{CK-WR\ (STABILIZE)}$, in the memory write example shown), is at least partially hidden under the time required to decode the incoming command ($t_{DECODE}$). That is, read/write clock stabilization and the command decode operations are executed concurrently (i.e., at least partly overlapping in time). Accordingly, as can be seen by contrasting the exemplary timing arrangement of FIG. 9A with the non-speculative approach of FIG. 4B, the overall write access time ($t_{CA-WR\ (ACCESS)}$) is reduced by two clock cycles as data (D0, D1, D2, D3, D4, . . . ) is received within the memory component five clock cycles after receipt of the write-access command instead of seven (the net reduction in transaction time may be greater or less than two clock cycles in alternative embodiments). Similarly, as can be seen by contrasting the speculative read-clock-enable approach ("Read Access with Speculative RD Clock Enable") within the read access shown in FIG. 9B (i.e., speculatively enabling the read and write clocks prior to completing decode of memory read command 661) with the non-speculative read-access of FIG. 4C, the speculative clock enable reduces the overall read access time ($t_{CA-RD\ (ACCESS)}$) by a number of clock cycles. After the incoming command is decoded and determined to be either a write command or read command, the unneeded data clock (i.e., read clock or write clock as the case may be) is disabled to save power. Thus, in the memory write access example of FIG. 9A, the read clock is disabled as shown at 653 while the write clock is enabled to continue oscillating. Conversely, in the memory read access example of FIG. 9B, the write-clock is disabled as shown at 663 while the read clock is enabled to continue oscillating (i.e., as shown in the shaded region of FIG. 9B designated "Speculative enable of RD/WR Clocks (shortening read-access latency)") to enable transmission of read data (Q0, Q1, Q2, Q3, Q4, . . . ) via the DQ interface of the memory component.

FIG. 10A illustrates an embodiment of a chip-enable logic circuit 681 that supports the speculative read and write clock enable functions described in reference to FIGS. 9A and 9B. As shown, chip-enable logic circuit 681 includes clock pipeline logic 683, configuration register 687 and clock trees 156, 158 and 160, with each of the clock trees being enabled by a respective one of logic gates 155, 365 and 367. Clock pipeline logic 683 includes clock latch circuitry 401, shift register 115, OR gate 117, and flip-flops 121 and 409 which operate generally as discussed above to generate pipeline interval signals (T[0]-T[N−1]) in response to an incoming chip-enable pulse, enabling oscillation of internal clock signal CKa until the last of the pipeline interval signals is asserted, and latching synthesized chip-select signal, CS-SYN, a predetermined number of clock cycles after receipt of the chip-enable signal. Clock pipeline logic 683 also includes an enable logic circuit 685 that operates generally as described in reference to FIG. 5A (e.g., implementing the Boolean expressions shown at 686) to produce read, write and command clock-enable signals (EnRD', EnWR' and EnCA' and thus synchronized signals EnRD, EnWR and EnCA via registers 417, 415 and 413), any or all of which may be implemented by multiple clock-enable signals as discussed in reference to FIGS. 6A/6B, 7A/7B and 8A/8B.

In one embodiment, shown for example in FIG. 10B, configuration register 687 includes a speculative-clock field 701 ("Spec CK Rd/Wr") that controls the speculative clock-enable function described in reference to FIGS. 9A and 9B. In the implementation shown, the speculative-clock field is implemented by a single bit, with speculative clock-enable being switched on or off (i.e., "Enable Spec Rd/Wr CK" or "Disable Spec Rd/Wr CK") according to whether the bit is in one logic state or another (i.e., '1' or '0'). Another programmable "delay control" field 703 ("$t_{CE-CK}$") is provided to control the delay ($t_{CE-CK}$) between receipt of a chip-enable signal and speculative read/write clock enable. In the exemplary implementation shown the same $t_{CE-CK}$ delay applies equally to speculative read and write clock enable operations (i.e., such that the read and write clocks are speculatively enabled at the same time), but separate, independently programmable $t_{CE-CK}$ delays may be supported in alternative embodiments. Similarly, while an exemplary 2-bit delay control field 703 is provided to enable selection of one of four $t_{CE-CK}$ delay values (i.e., 0.5 clock cycle ("$1xt_{CYC}/2$"), 1 clock cycle ("$2xt_{CYC}/2$"), 1.5 clock cycle ("$3xt_{CYC}/2$") or 2 clock cycles ("$4xt_{CYC}/2$")), more or fewer bits may be provided to encode the delay in alternative embodiments, and/or time delay values different than shoes shown may be encoded.

FIG. 10A illustrates an exemplary set of combinatorial logic operations 686 implemented by enable logic circuit 685 when speculative clocking is enabled. More specifically, read-clock enable signal, EnRD', is speculatively enabled during initial clock pipeline intervals T[0] and T[1] (i.e., by logically ORing those signals to create the EnRD' signal) and thereafter during pipeline intervals T[2] through T[N−1] if the incoming command indicates a memory read operation (i.e., decode logic asserts read-enable signal, RD). Similarly, write-clock enable signal, EnWR' is speculatively enabled during initial clock pipeline intervals T[0] and T[1], and thereafter during pipeline intervals T[2] through T[N−1] if the incoming command indicates a memory read operation. As in embodiments above, the specific set of pipeline intervals over which the read and write clocks are enabled, speculatively or otherwise, may differ in alternative embodiments or configurations.

FIG. 10C illustrates an exemplary sequence of operations that may be carried out within a control component to detect and enable speculative clock-enable capability and/or support for programmable CE-to-CK delay within attached memory components. At 711, the control component reads configuration information within a serial presence detect (SPD) memory or other configuration source to determine whether attached memory ranks (or rank) support speculative clock enabling or programmable CE-to-CK delay. If so (i.e., affirmative determination at 713), the control component issues mode register programming commands and operands at 715 to configurable memory ranks to configure constituent memory components for speculative read/write clock enable (i.e., switching on the speculative clock enable operation) and/or to configure constituent memory components for desired CE-to-CK delay intervals. As explained above, independent read and write CE-to-CK intervals may be programmed within memory components that provide separate programmable fields for those delays.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific numbers of bits, signal path widths, signaling or operating frequencies, component circuits or devices and the like may be different from those described above in alternative embodiments. Additionally, links or other interconnection between integrated circuit devices or internal circuit elements or blocks may be shown as buses or as single signal lines. Each of the buses may alternatively be a single signal line, and each of the single signal lines may alternatively be buses. Signals and signaling links, however shown or described, may be single-ended or differential. A signal driving circuit is said to "output" a signal to a signal receiving circuit when the signal driving circuit asserts (or deasserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" may include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement.

Various modifications and changes may be made to the embodiments presented herein without departing from the broader spirit and scope of the disclosure. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. An integrated circuit memory component comprising:
   first logic to assert a chip-select signal in response to detecting a transition of an externally-generated control signal and to enable a predetermined number of transitions of a timing signal in response to detecting the transition of the externally-generated control signal;
   second logic to decode a command in response to assertion of the chip-select signal; and
   circuitry to perform operations indicated by the command at respective times indicated by respective transitions of the timing signal.

2. The integrated-circuit device of claim 1 wherein the first logic comprises circuitry to assert the chip-select signal a predetermined time after detecting the transition of the externally-generated control signal.

3. The integrated-circuit device of claim 1 wherein the first logic comprises a first register having a signal input coupled to receive the externally-generated control signal and a timing input to receive an externally-generated clock signal, the register to detect the transition of the externally-generated control signal by generating, in response to a transition of the externally-generated clock signal, an output representative of a state of the externally-generated control signal such that the output of the first register transitions from a first state to a second state following the transition of the externally-generated control signal.

4. The integrated-circuit device of claim 3 wherein the first logic comprises a second register having a signal input coupled to receive the output of the first register and an output that constitutes the chip-select signal.

5. The integrated-circuit device of claim 3 further comprising a shift register having an input coupled to the output of the first register, wherein the transition of the output of the first register from the first state to the second state produces a sequence of transitions within constituent registers of the shift register, and wherein the predetermined number of transitions of the timing signal corresponds to the number of transitions in the sequence of transitions within the constituent registers of the shift register.

6. The integrated-circuit memory component of claim 1 further comprising logic to generate a command clock during selected cycles of the timing signal such that the command clock pulses a predetermined number of times in response to detecting the transition of the externally-generated control signal, the predetermined number of times corresponding to a number of command clock timing edges required to receive the command and deliver the command to the second logic.

7. The integrated-circuit memory component of claim 1 further comprising
   a memory core, and wherein the circuitry to perform operations indicated by the command comprises
   logic to generate a write clock during selected cycles of the timing signal such that the write clock pulses a predetermined number of times in response to detecting the transition of the externally-generated control signal, the predetermined number of times corresponding to a number of write clock timing edges required to receive a sequence of write data values and deliver the sequence of write data values, as a parallel write data word, to the memory core.

8. The integrated-circuit memory component of claim 7 wherein the circuitry to perform operations indicated by the command further comprises a write-data deserialization circuitry having a plurality of deserializing stages coupled in series, each of the deserializing stages to output a value that represents a parallel combination of two or more values received at an input of the deserializing stage, and wherein the logic to generate the write clock comprises logic to generate a plurality of stage-specific write clocks that are supplied to the plurality of deserializing stages, respectively, and wherein the logic to generate the write clock such that the write clock pulses a predetermined number of times comprises logic to enable each of the stage-specific write clocks to pulse a number of times corresponding to a number of values to be received in sequence within the respective deserializing stage.

9. The integrated-circuit memory component of claim 1 further comprising
   a memory core,
   and wherein the circuitry to perform operations indicated by the command comprises logic to generate a read clock during selected cycles of the timing signal such that the read clock pulses a predetermined number of times in response to detecting the transition of the externally-generated control signal, the predetermined number of times corresponding to a number of read clock timing edges required to convert a read data word, received from the memory core, into a sequence of read data values and to output the sequence of read data values from the integrated-circuit memory component.

10. The integrated-circuit memory component of claim 9 wherein the circuitry to perform operations indicated by the command further comprises read-data serialization circuitry having a plurality of serializing stages coupled in series, each of the serializing stages to output a sequence of values that correspond to a parallel value received at an input of the serializing stage, and wherein the logic to generate the read clock comprises logic to generate a plurality of stage-specific read clocks that are supplied to the plurality of serializing stages, respectively, and wherein the logic to generate the read clock such that the read clock pulses a predetermined number of times comprises logic to enable each of the stage-specific read clocks to pulse a number of times corresponding to a number of values to be output in sequence within the respective serializing stage.

11. A method of operation within an integrated circuit memory component, the method comprising:
- asserting a chip-select signal in response to detecting a transition of an externally-generated control signal;
- decoding a command value in response to assertion of the chip-select signal;
- enabling a predetermined number of transitions of a timing signal in response to detecting the transition of the externally-generated control signal; and
- performing operations indicated by the command at respective times indicated by respective transitions of the timing signal.

12. The method of claim 11 wherein asserting the chip-select signal comprises asserting the chip-select signal a predetermined time after detecting the transition of the externally-generated control signal.

13. The method of claim 11 wherein asserting the chip-select signal in response to detecting the transition of the externally-generated control signal comprises latching the externally-generated control signal within a first register in response to an externally-generated clock signal, the first register generating, in response to a transition of the externally-generated clock signal, an output representative of a state of the externally-generated control signal such that the output of the first register transitions from a first state to a second state following the transition of the externally-generated control signal.

14. The method of claim 13 wherein asserting the chip-select signal in response to detecting the transition of the externally-generated control signal further comprises latching the output of the first register within a second register having an output that constitutes the chip-select signal.

15. The method of claim 13 wherein enabling a predetermined number of transitions of a timing signal in response to detecting the transition of the externally-generated control signal comprises generating a sequence of transitions within constituent registers of a shift register in response to the transition of the output of the first register from the first state to the second state, wherein the predetermined number of transitions of the timing signal corresponds to the number of transitions in the sequence of transitions within the constituent registers of the shift register.

16. The method of claim 11 wherein decoding the command value in response to assertion of the chip-select signal comprises decoding the command value in a decoding circuit, the method further comprising generating a command clock during selected cycles of the timing signal such that the command clock pulses a predetermined number of times in response to detecting the transition of the externally-generated control signal, the predetermined number of times corresponding to a number of command clock timing edges required to receive the command and deliver the command to the command decoding circuit.

17. The method of claim 11 further comprising generating a write clock during selected cycles of the timing signal such that the write clock pulses a predetermined number of times in response to detecting the transition of the externally-generated control signal, the predetermined number of times corresponding to a number of write clock timing edges required to receive a sequence of write data values and deliver the sequence of write data values, as a parallel write data word, to a memory core of the integrated-circuit memory component.

18. The method of claim 17 wherein the integrated-circuit memory component comprises write-data deserialization circuitry having a plurality of deserializing stages coupled in series, each of the deserializing stages to output a value that represents a parallel combination of two or more values received at an input of the deserializing stage, and wherein generating the write clock comprises generating a plurality of stage-specific write clocks that are supplied to the plurality of deserializing stages, respectively, and wherein generating the write clock such that the write clock pulses a predetermined number of times comprises enabling each of the stage-specific write clocks to pulse a number of times corresponding to a number of values to be received in sequence within the respective deserializing stage.

19. The method of claim 11 further comprising generating a read clock during selected cycles of the timing signal such that the read clock pulses a predetermined number of times in response to detecting the transition of the externally-generated control signal, the predetermined number of times corresponding to a number of read clock timing edges required to convert a read data word, received from a memory core of the integrated-circuit memory component, into a sequence of read data values and to output the sequence of read data values from the integrated-circuit memory component.

20. The method of claim 19 wherein the integrated-circuit memory component comprises read-data serialization circuitry having a plurality of serializing stages coupled in series, each of the serializing stages to output a sequence of values that correspond to a parallel value received at an input of the serializing stage, and wherein generating the read clock comprises generating a plurality of stage-specific read clocks that are supplied to the plurality of serializing stages, respectively, and wherein generating the read clock such that the read clock pulses a predetermined number of times comprises enabling each of the stage-specific read clocks to pulse a number of times corresponding to a number of values to be output in sequence within the respective serializing stage.

21. An integrated circuit memory component comprising:
- first logic to decode an externally-generated command value to determine a commanded operation; and
- second logic to enable oscillation of a write clock signal prior to determination of the commanded operation, and to either continue to enable oscillation of the write clock signal or disable oscillation of the write clock signal after determination of the commanded operation according to whether the commanded operation requires reception of write data.

22. The integrated circuit memory component of claim 21 wherein the second logic to enable oscillation of the write clock signal prior to determination of the commanded operation comprises circuitry to enable oscillation of the write clock signal while the first logic is decoding the externally-supplied command value.

23. The integrated circuit memory component of claim 21 wherein the second logic comprises circuitry to enable oscillation of a read clock signal prior to determination of the commanded operation and to either continue to enable oscillation of the read clock signal or disable oscillation of the read clock signal after determination of the commanded operation according to whether the commanded operation requires transmission of read data.

24. The integrated circuit memory component of claim 21 further comprising circuitry to receive a sequence of write data values and convert the sequence of write data values into a parallel write data word in response to a plurality of timing edges, wherein transitions of the write clock signal constitute at least a portion of the timing edges.

25. The integrated circuit memory component of claim 21 further a programmable register to store a mode value received from an external source, and wherein the second logic to enable oscillation of the write clock signal prior to determination of the commanded operation comprises logic to enable oscillation of the write clock signal prior to determination of the commanded operation if the mode value stored within the programmable register indicates that the write clock signal is to be speculatively enabled.

26. A method of operation within an integrated circuit memory component, the method comprising:
   decoding an externally-generated command value to determine a commanded operation;
   enabling oscillation of a write clock signal prior to determination of the commanded operation; and
   after determination of the commanded operation, either continuing to enable oscillation of the write clock signal or disabling oscillation of the write clock signal according to whether the commanded operation requires reception of write data.

27. The method of claim 26 wherein enabling oscillation of the write clock signal prior to determination of the commanded operation comprises enabling oscillation of the write clock signal while decoding the externally-supplied command value.

28. The method of claim 26 further comprising:
   enabling oscillation of a read clock signal prior to determination of the commanded operation; and
   after determination of the commanded operation, either continuing to enable oscillation of the read clock signal or disabling oscillation of the read clock signal according to whether the commanded operation requires transmission of read data.

29. The method of claim 26 further comprising receiving a sequence of write data values and converting the sequence of write data values into a parallel write data word in response to a plurality of timing edges, wherein transitions of the write clock signal constitute at least a portion of the timing edges.

30. The method of claim 26 further comprising storing a mode value received from an external source within a programmable register of the integrated-circuit memory device, and wherein enabling oscillation of the write clock signal prior to determination of the commanded operation comprises enabling oscillation of the write clock signal prior to determination of the commanded operation if the mode value stored within the programmable register indicates that the write clock signal is to be speculatively enabled.

31. An integrated circuit memory component comprising:
   means for asserting a chip-select signal in response to detecting a transition of an externally-supplied control signal;
   means for decoding a command value in response to assertion of the chip-select signal;
   means for enabling a predetermined number of transitions of a timing signal in response to detecting the transition of the externally-supplied control signal; and
   means for performing operations indicated by the command at respective times indicated by respective transitions of the timing signal.

* * * * *